(12) United States Patent
Saita

(10) Patent No.: US 10,658,200 B2
(45) Date of Patent: May 19, 2020

(54) THIN FILM COMPONENT SHEET, BOARD WITH BUILT-IN ELECTRONIC COMPONENT, AND METHOD OF MANUFACTURING THE THIN FILM COMPONENT SHEET

(71) Applicant: TDK CORPORATION, Tokyo (JP)

(72) Inventor: Hitoshi Saita, Tokyo (JP)

(73) Assignee: TDK CORPORATION, Tokyo (JP)

(*) Notice: Subject to any disclaimer, the term of this patent is extended or adjusted under 35 U.S.C. 154(b) by 26 days.

(21) Appl. No.: 15/467,685

(22) Filed: Mar. 23, 2017

(65) Prior Publication Data

US 2017/0290165 A1  Oct. 5, 2017

(30) Foreign Application Priority Data

Mar. 30, 2016 (JP) ................. 2016-068787

(51) Int. Cl.
| | | |
|---|---|---|
| *H01L 21/00* | (2006.01) | |
| *H01L 21/48* | (2006.01) | |
| *H01L 23/498* | (2006.01) | |
| *H01G 4/33* | (2006.01) | |
| *H01L 23/00* | (2006.01) | |
| *H05K 3/46* | (2006.01) | |
| *H05K 3/42* | (2006.01) | |
| *H05K 1/16* | (2006.01) | |

(52) U.S. Cl.
CPC .............. *H01L 21/486* (2013.01); *H01G 4/33* (2013.01); *H01L 23/49827* (2013.01);
(Continued)

(58) Field of Classification Search
CPC ........ H05K 1/187; H05K 1/116; H05K 3/007; H05K 3/0094; H05K 3/306; H05K 3/321; H05K 3/4617; H05K 2203/0147; H05K 2203/1305; H05K 2201/09581; H01L 21/4857; H01L 21/486; H01L 23/49822; H01L 23/49827; H01L 24/16; H01L 2224/16227; H01L 2224/16235
See application file for complete search history.

(56) References Cited

U.S. PATENT DOCUMENTS

| | | | |
|---|---|---|---|
| 7,351,915 B2* | 4/2008 | Ahn ................. | H01G 4/1209 |
| | | | 174/260 |
| 8,391,015 B2* | 3/2013 | Tanaka ............ | H01L 23/49822 |
| | | | 361/760 |

(Continued)

FOREIGN PATENT DOCUMENTS

| | | |
|---|---|---|
| JP | H09-232695 A | 9/1997 |
| JP | 2001-307923 A | 11/2001 |

(Continued)

*Primary Examiner* — Pete T Lee
(74) *Attorney, Agent, or Firm* — Oliff PLC

(57) ABSTRACT

A thin film component sheet includes: a conducting interconnection layer formed of a conductor; an insulating layer that is laminated on the conducting interconnection layer and is formed of an insulating material; and a plurality of thin film electronic components, each of which has a pair of first and second electrode layers and a dielectric layer provided between the first and second electrode layers, and which are arranged to be separated on the insulating layer. In a state in which a main surface of the first electrode layer in each of the plurality of thin film electronic components is exposed to an outside on a main surface of one side of the thin film component sheet, a flat surface of the main surface of the thin film component sheet is formed.

11 Claims, 12 Drawing Sheets

(52) U.S. Cl.
CPC .... *H01L 21/4857* (2013.01); *H01L 23/49822* (2013.01); *H01L 24/16* (2013.01); *H01L 2224/16227* (2013.01); *H01L 2224/16235* (2013.01); *H05K 1/162* (2013.01); *H05K 3/429* (2013.01); *H05K 3/4644* (2013.01); *H05K 2201/09536* (2013.01); *H05K 2201/09672* (2013.01); *H05K 2201/10015* (2013.01)

(56) References Cited

U.S. PATENT DOCUMENTS

| | | | | |
|---|---|---|---|---|
| 2003/0063453 | A1* | 4/2003 | Kusagaya | H05K 3/4602 361/794 |
| 2006/0291177 | A1* | 12/2006 | Choi | H01L 24/24 361/780 |
| 2007/0086145 | A1* | 4/2007 | Kubota | H01L 23/49822 361/311 |
| 2007/0109720 | A1* | 5/2007 | Kamei | H01G 4/1227 361/321.2 |
| 2008/0072409 | A1 | 3/2008 | Kato et al. | |
| 2008/0158777 | A1* | 7/2008 | Sohn | H01G 4/232 361/321.1 |

FOREIGN PATENT DOCUMENTS

| | | |
|---|---|---|
| JP | 2002-008939 A | 1/2002 |
| JP | 2004-103967 A | 4/2004 |
| JP | 2006-245104 A | 9/2006 |
| JP | 2007-335818 A | 12/2007 |
| JP | 2008-034417 A | 2/2008 |
| JP | 2008-034418 A | 2/2008 |

\* cited by examiner

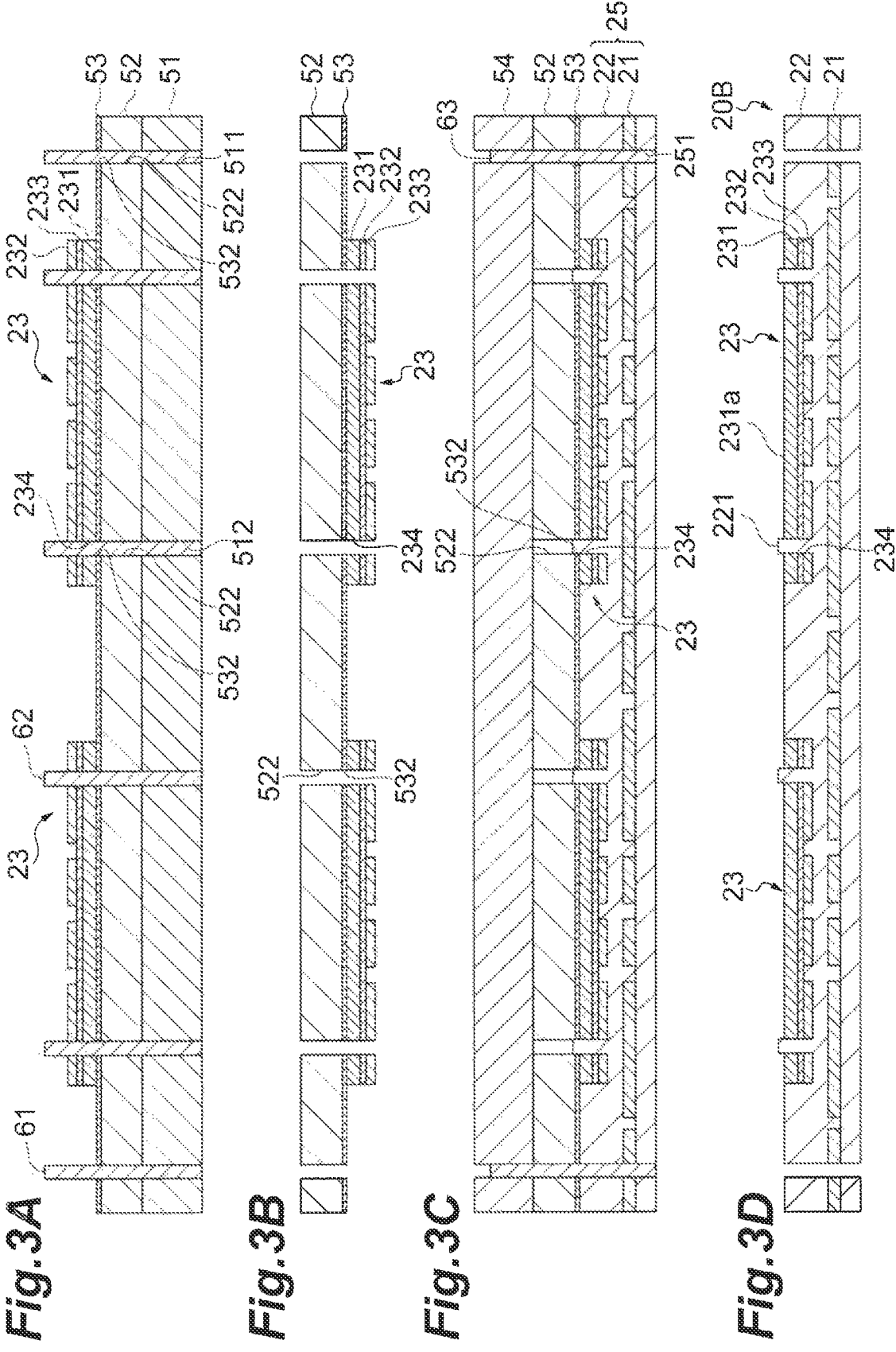

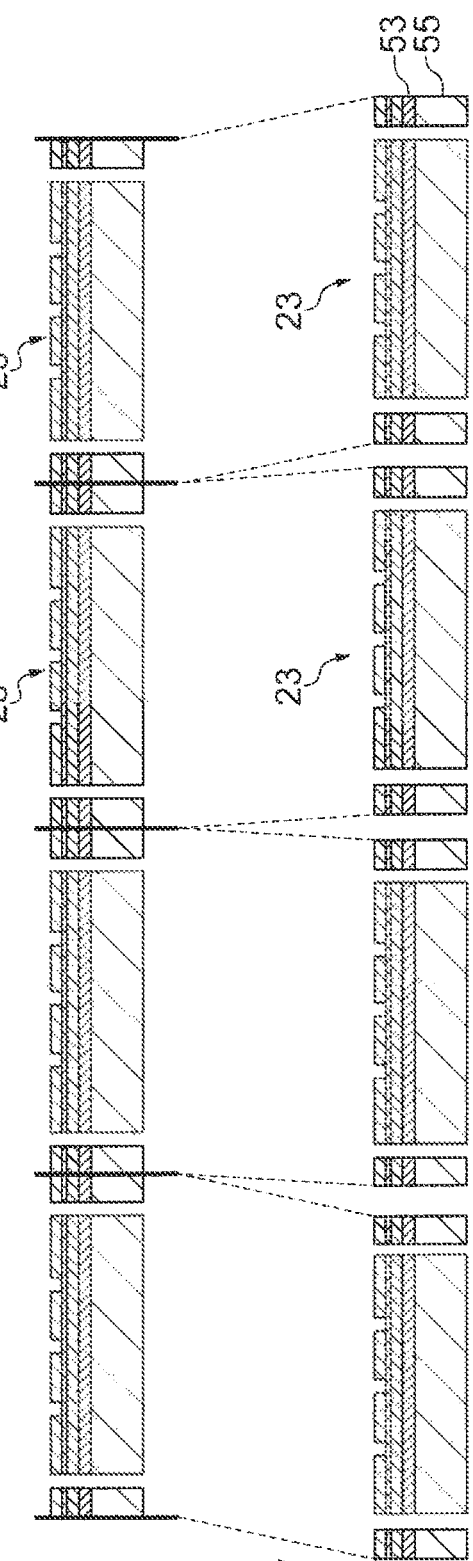

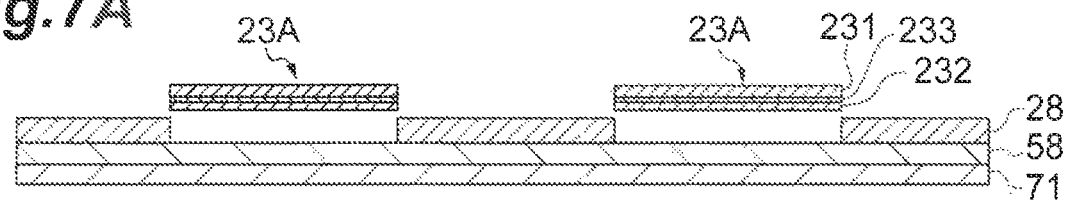
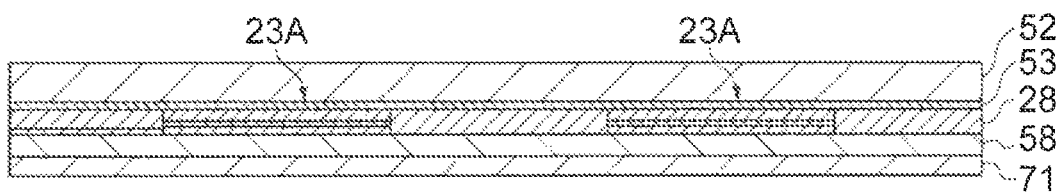
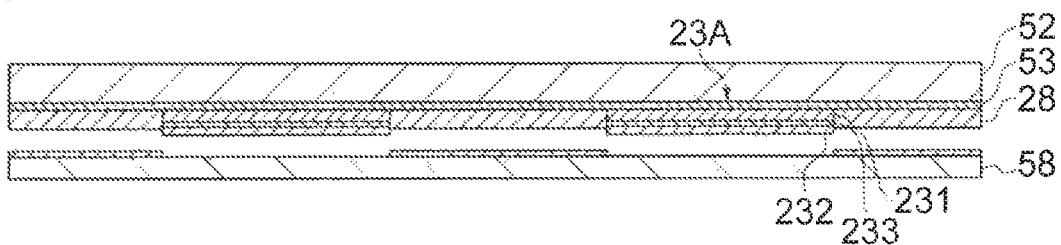

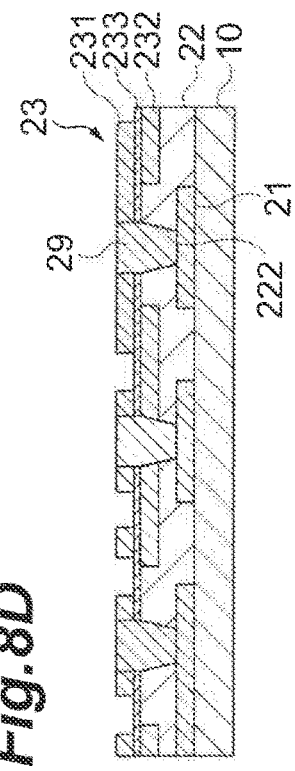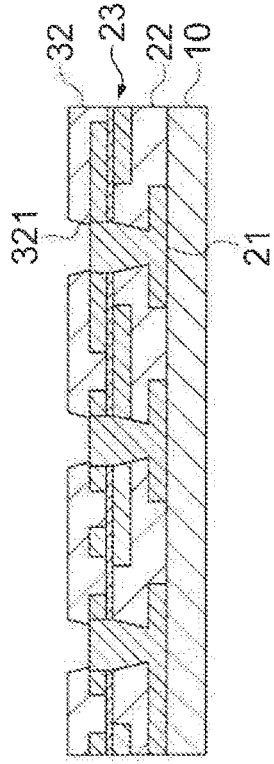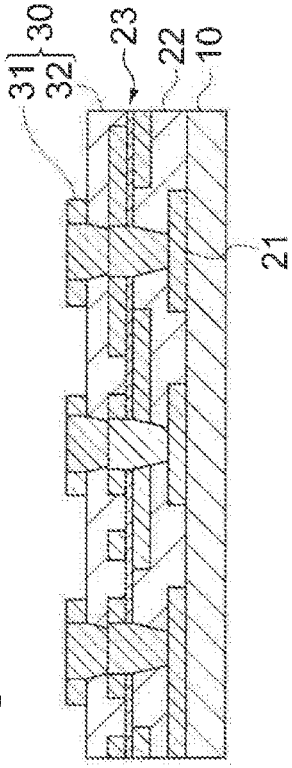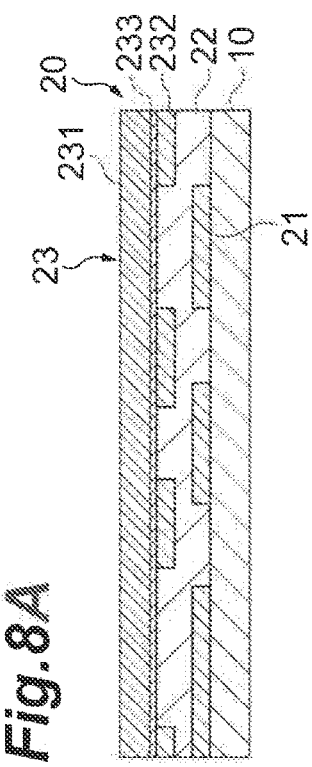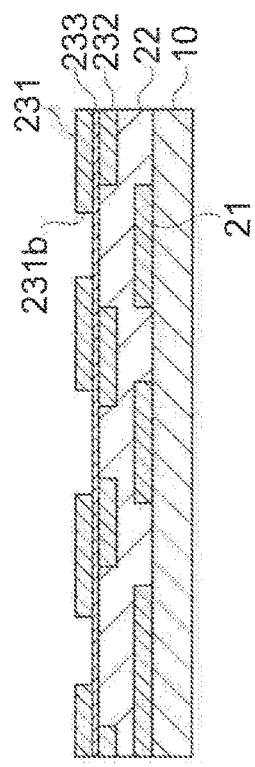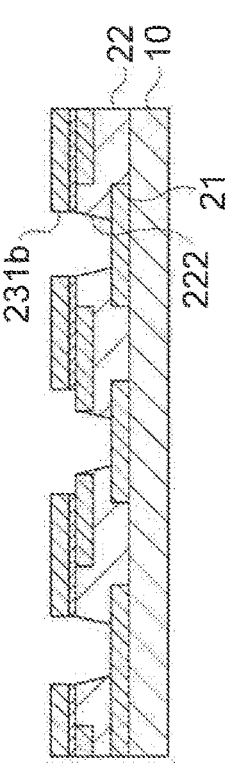

THIN FILM COMPONENT SHEET, BOARD WITH BUILT-IN ELECTRONIC COMPONENT, AND METHOD OF MANUFACTURING THE THIN FILM COMPONENT SHEET

TECHNICAL FIELD

The present invention relates to a thin film component sheet including the thin film component sheet, a board with built-in electronic component, and a method of manufacturing the thin film component sheet.

BACKGROUND

It has been requested that electronic components used in boards with built-in electronic components be thinned while maintaining high performance, and this has been studied from various angles (for example, Japanese Unexamined Patent Publication Nos. 2008-34417 and 2008-34418). So far, electronic components have been manufactured in shapes corresponding to the boards when the boards with built-in electronic components have been manufactured in consideration of handleability, positioning accuracy, or the like. After electronic components are mounted on the hoards, the electronic components are processed into desired shapes by patterning or like.

SUMMARY

However, it is difficult to improve a yield of sheet-like electronic components used in the boards with built-in electronic components manufactured in the above manufacturing method because of a large area, and it is conceivable that costs will be increased because materials of the electronic components are used at portions at which functions of the electronic components are not required. Meanwhile, a drop in yield derived from positioning accuracy is considered when an attempt is made to individually arrange the electronic components.

The present invention was made in terms of the foregoing, and an object thereof is to provide a thin filth component sheet that improves handleability while suppressing an increase in cost, a board with built-in electronic component including the thin film component sheet, and a method of manufacturing the thin film component sheet.

To achieve the object, a thin film component sheet according to an aspect of the present invention includes: an interconnection layer formed of a conductor; an insulating layer laminated on the interconnection layer and formed of an insulating material; and a plurality of thin film electronic components, each having a pair of electrode layers and a dielectric layer provided between the pair of electrode layers, and arranged to be separated on the insulating layer. In a state in which a main surface of one of the electrode layers in each of the plurality of thin film electronic components is exposed to an outside on a main surface of one side of the thin film component sheet, a flat surface of the main surface of the thin film component sheet is formed.

According to the thin film component sheet, since the plurality of thin film electronic components are arranged to be separated from each other, a cost is suppressed in comparison with conventional sheet-like electronic components. Since the thin film electronic components are arranged on the insulating layer, handleablity is improved in comparison with a case in which each individual piece of the electronic component is handled. The sheet in which the main surface of one electrode layer in each the plurality of thin film electronic components is exposed to the main surface of one side of the thin film component sheet can be manufactured by a relatively simple process, and a manufacturing cost can be suppressed.

Here, the flat surface may be formed on the main surface of the one side of the thin film component sheet by the insulating layer and the main surface of the one electrode layer in each of the plurality of thin film electronic components.

In the case of the above configuration, the insulating layer is configured to be filled between the plurality of thin film electronic components. Therefore, portions other than the thin film electronic components and a conducting interconnection layer can be formed by the insulating layer, and a thin film component sheet having excellent handleability can be inexpensively manufactured.

Further, the thin film component sheet may further include a metal layer arranged on the insulating layer and formed between neighboring thin film electronic components among the plurality of thin film electronic components. The flat surface may be formed on the main surface of the one side of the thin film component sheet by the metal layer and the main surface of the one electrode layer in each of the plurality of thin film electronic components.

As described above, the metal layer is filled between the neighboring thin film electronic components. Thereby, since an area where electrode layers and a dielectric layer are provided in the related art can be replaced with the metal layer, a drop in cost is realized. Further, in the thin film component sheet in Which the metal layer is filled between the neighboring thin film electronic components, rigidity is enhanced and handleability as the sheet is improved.

Further, the thin film electronic components may have through-holes extending in a thickness direction thereof, and the insulating material of the insulating layer may be filled in the through-holes. The insulating material is filled in the through-holes, and thereby peeling between the thin film electronic components and the insulating layer can be effectively suppressed and handleability of the thin film component sheet is further improved.

Further, the main surface of the one side of the thin film component sheet may have recesses through which the insulating material in the through-holes protrudes. The insulating material in the through-holes protrudes so that adhesion strength is further improved when the thin film component sheet is used in a board with built-in electronic component.

The thin film component sheet may further include second through-holes, which pass through the insulating layer and the interconnection layer and extend in the thickness direction, at positions at which the second through-holes do not pass through the thin film electronic components in the thickness direction. Since the thin film component sheet has the second through-holes, positioning and fixing of the thin film component sheet are eased. Even if strain occurs when the thin film component sheet is handled, the strain can be absorbed by the second through-holes, and thus the handleability of the thin film component sheet is further improved.

A board with built-in electronic component according to another aspect of the present invention includes: the thin film component sheet; and an interconnection layer laminated on the thin film component sheet.

In the board with built-in electronic component, since the thin film component sheet in which the plurality of thin film electronic components are arranged to be separated from each other is used, a manufacturing cost of the board with built-in electronic component is suppressed in comparison with conventional sheet-like electronic components. The thin film electronic components are arranged on the insulating layer, and thereby the handleablity is improved in comparison with a case in which each individual piece of the electronic component is handled. The sheet in which the main surface of the one electrode layer in each of the plurality of thin film electronic components is exposed to the main surface of one side of the thin film component sheet can be manufactured by a relatively simple process, and a manufacturing cost can be suppressed.

Further, a method of manufacturing a thin film component sheet according to another aspect of the present invention, the thin film component sheet including an interconnection layer formed of a conductor, an insulating layer laminated on the interconnection layer and formed of an insulating material, and a plurality of thin film electronic components, each having a pair of electrode layers and a dielectric layer provided between the pair of electrode layers, and arranged to be separated on the insulating layer, includes: a thin film electronic component preparing process of preparing a carrier sheet to which the plurality of thin film electronic components are adhered; a thin film electronic component embedding process of pressing the carrier sheet, to which the thin film electronic components are adhered, against an insulating layer of an interconnection structure in which the interconnection layer and the insulating layer are laminated, to thereby embed the thin film electronic components into the insulating layer and form a flat surface of a main surface of one side of the thin film component sheet; and a sheet removing process of removing the carrier sheet to expose a main surface of one of the electrode layers in each of the plurality of thin film electronic components to an outside on the main surface of the one side of the thin film component sheet.

According to the method of manufacturing a thin film component sheet, the thin film component sheet in which the plurality of thin film electronic components are arranged to be separated from each other can be manufactured. Therefore, the thin film component sheet can be manufactured while suppressing a cost related to manufacturing in comparison with conventional sheet-like electronic components. The thin film electronic components are arranged on the insulating layer, and thereby the thin film component sheet in which handleablity is improved can be manufactured in comparison with a case in which each individual piece of the electronic component is handled. Further, the sheet in which the main surface of the one electrode layer in each of the plurality of thin film electronic components is exposed to the main surface of one side of the thin film component sheet can be manufactured by a relatively simple process, and a manufacturing cost can be suppressed.

Here, the thin film electronic component embedding process may include inserting pins into through-holes provided in the interconnection structure and through-holes provided in the carrier sheet and performing positioning of the interconnection structure and the carrier sheet.

In this way, the positioning is performed using the pins so that the positioning of the interconnection structure and the carrier sheet can be easily performed and the manufacturing cost can be further suppressed.

The thin film electronic component preparing process may include inserting pins into through-holes provided in the thin film electronic components and through-holes provided in the carrier sheet and performing positioning of the thin film electronic components and the carrier sheet.

In this way, the positioning is performed using the pins so that the positioning of the thin film electronic components and the carrier sheet can be easily performed and the manufacturing cost can be further suppressed.

The thin film electronic component preparing process may include preparing the carrier sheet to which the plurality of thin film electronic components and a metal layer provided between the plurality of thin film electronic components are adhered, and the thin film electronic component embedding process may include pressing the carrier sheet, to which the thin film electronic components and the metal layer are adhered, against the insulating layer of the interconnection structure in which the interconnection layer and the insulating layer are laminated, to thereby embed the thin film electronic components into the insulating layer and form the flat surface of the main surface of the one side of the thin film component sheet.

As described above, the metal layer is arranged between the neighboring thin film electronic components. Thereby, in the related art, since a thin film component sheet in which an area where electrode layers and a dielectric layer are provided is replaced with the metal layer can be manufactured, a drop in cost is realized. Further, in the thin film component sheet in which the metal layer is filled between the neighboring thin film electronic components, rigidity is enhanced and handleability of the sheet is improved.

The thin film electronic component preparing process may include adhering the carrier sheet to the thin film electronic components in a state in which the thin film electronic components are arranged above a jig plate to correspond to adhesion positions and are held by magnets.

As described above, since the positioning of the thin film electronic components and the carrier sheet is performed using the magnets, a process of positioning is performed without using the pins. For example, the positioning can be performed without using the through-holes for positioning. In this case, the thin film component sheet can be manufactured using thin film electronic components that are more compact.

According to the present invention, a thin film component sheet that improves handleability while suppressing an increase in cost, a board with built-in electronic component including the thin film component sheet, and a method of manufacturing a thin film component sheet are provided.

BRIEF DESCRIPTION OF THE DRAWINGS

FIGS. 3A, 3B, 3C, and 3D are views illustrating a method of manufacturing the thin film component sheet (a first method).

FIGS. 4A, 4B, 4C, 4D and 4E are views illustrating a method of manufacturing the thin film component sheet (a second method).

FIGS. 7A, 7B, 7C, 7D, 7E, 7F, and 7G are views illustrating a method of manufacturing the thin film component sheet (a fourth method).

FIGS. 8A, 8B, 8C, 8D, 8E, and 8F are views illustrating a part of a method of manufacturing the board with built-in electronic component.

DETAILED DESCRIPTION

Hereinafter, an embodiment for carrying out the present invention will be described with reference to the attached drawings. Note that, in the description of the drawings, the same elements are given the same reference signs, and duplicate description thereof will be omitted.

(Board Mounting Structure)

Figure 1:
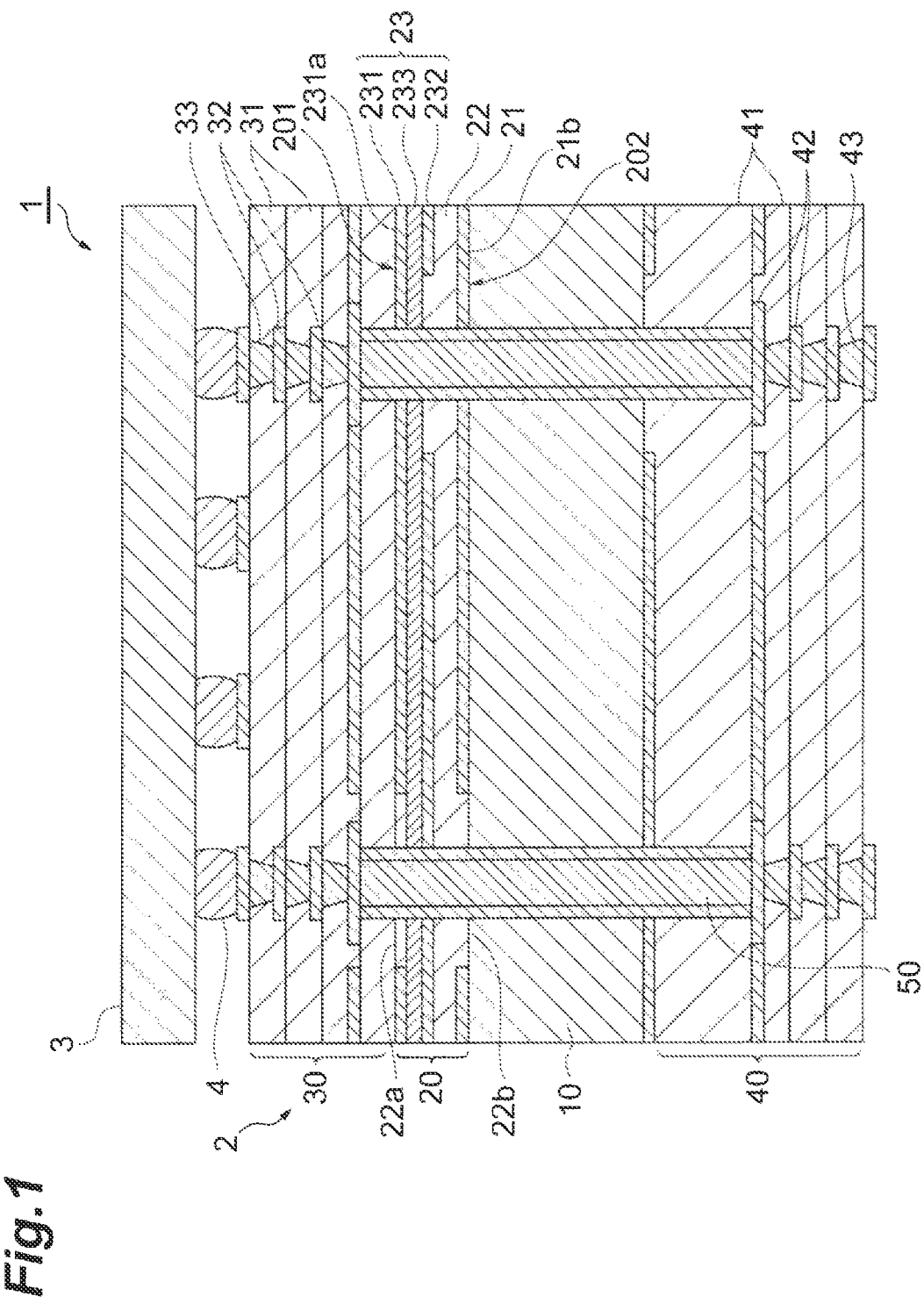
FIG. 1 is a schematic sectional view of a board mounting structure using a board with built-in electronic component according to an embodiment of the present invention.

FIG. 1 is a schematic configuration view illustrating a board mounting structure including a board with built-in electronic component according to an embodiment of the present invention. The board mounting structure illustrated in FIG. 1 is used for electronic devices such as communication terminals, health care devices, and the like.

As illustrated in FIG. 1, a board mounting structure 1 includes a board 2 with built-in electronic component in which a thin film electronic component is mounted, and an electronic component 3 that is mounted on a main surface of the board 2 with built-in electronic component. The board 2 with built-in electronic component to be described in detail is a board that has a thin film electronic component and wiring layers. The electronic component 3 is flip-chip mounted on the board 2 with built-in electronic component via bumps 4 containing a conductive material. The electronic component 3 can use a semiconductor chip such as, for example, an IC chip, but is not particularly limited thereto. The board mounting structure 1 illustrated in FIG. 1 can be configured to use an active component as the electronic component 3 and use a passive component as the thin film electronic component inside the board 2 with built-in electronic component.

(Board with Built-In Electronic Component and Thin Film Component Sheet)

The board 2 with built-in electronic component includes a core board 10, a thin film component sheet 20 that is laminated on a main surface of one side of the core board 10, an interconnection layer 30 that is formed on a main surface of the thin film component sheet 20, an interconnection layer 40 that is laminated on a main surface of the other side of the core board 10, and through-hole vias 50 that connect the interconnection layers 30 and 40. Among these components, the thin film component sheet 20 includes a first electronic component.

An insulating material may be properly used as the core board 10. The insulating material used properly as the core board 10 is not particularly limited as long as it has an insulating property and can be formed in a sheet shape or a film shape. For example, a well-known material such as a silicon substrate, an organic substrate formed of a glass epoxy resin or a bismaleimide triazine (BT) resin, or the like may be used. The core board 10 may have, for instance, a resin coated cupper (RCC) structure. A conductor layer made up of, for instance, copper foil may be used as the core board 10.

An adhesive layer may be provided between the core board 10 and the thin film component sheet 20. The adhesive layer is not particularly limited as long as it can be configured to fix the thin film component sheet 20 to the core board 10. For example, a resin before thermosetting (prepreg, a filler-containing composite material, etc.), an adhesive (an adhesive-coated sheet, a metal powder-containing paste, etc.) or the like may be used. An interconnection layer formed by a separate conductor layer and a separate insulating layer may be provided between the core board 10 and the thin film component sheet 20.

In the present embodiment, the thin film component sheet 20 is laminated on the core board 10 and has a conducting interconnection layer (an interconnection layer) 21, an insulating layer 22, and a thin film electronic component 23, The thin film component sheet 20 shown in FIG. 1 has a sheet shape in which a thickness is substantially uniform. The conducting interconnection layer 21 is exposed to one main surface of the thin film component sheet 20 (a main surface directed toward the core board 10), and an electrode layer (a first electrode layer 231) of one side of the thin film electronic component 23 is exposed to the other main surface of the thin film component sheet 20 (a main surface directed toward the interconnection layer 30).

The conducting interconnection layer 21 of the thin film component sheet 20 can be formed by patterning a conductor. A material of the conductor is not particularly limited, and may use an alloy or the like containing nickel (Ni) or copper (Cu) as a main component. "Main component" means that a proportion occupied by the corresponding component is higher than or equal to 50 mass %.

A configuration and a function of the thin film electronic component 23 provided at the thin film component sheet 20 are not particularly limited. In the present embodiment, a case in which the thin film electronic component 23 has a pair of electrode layers (the first electrode layer 231 and a second electrode layer 232) and a dielectric layer 233 provided between the electrode layers, and functions as a thin film capacitor will be described.

When the thin film electronic component 23 functions as a thin film capacitor, a material that is an alloy whose main component contains nickel (Ni), copper (Cu), platinum (Pt), or all of those metals or that is an intermetallic compound is properly used as a material of each of the first electrode layer 231 and the second electrode layer 232. However, the materials of the first electrode layer 231 and the second electrode layer 232 are not particularly limited as long as they are conductive materials. In the present embodiment, a case in which the first electrode layer 231 uses nickel as a main component and a case in which the second electrode layer 232 uses copper as a main component will be described. Modes of the first electrode layer 231 and the second electrode layer 232 also include a case in which they are laminated structures composed of two or more type of material as well as a case of being formed of the alloy or the intermetallic compound. For example, an electrode layer may be formed as a two-layered structure in which a Cu thin film is provided on a Ni thin film. When pure Ni is used as the first electrode layer 231 and/or the second electrode layer 232, the purity of Ni is preferably greater than or equal to 99.99%. Further, in the case of an alloy containing Ni, a metal contained as a metal other than Ni is preferable as long as it is at least one selected from the group consisting of platinum (Pt), palladium (Pd), iridium (Ir), rhodium (Rh), ruthenium (Ru), osmium (Os), rhenium (Re), tungsten (W), chromium (Cr), tantalum (Ta), silver (Ag), and copper (Cu).

In addition, the dielectric layer 233 is formed of a perovskite-based dielectric material. Here, the perovskite-based dielectric material in the present invention includes a (strong) dielectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, $Pb(Zr_xTi_{1-x})O_3$ or the like, and a composite perovskite relaxer type ferroelectric material of which $Pb(Mg_{1/3}Nb_{2/3})O_3$ or the like is representative. Here, in the perovskite structure and the perovskite relaxer type ferroelectric material, a ratio between A sites and B sites is normally an integer ratio, but the ratio may intentionally deviate from an integer ratio in order to improve characteristics. The dielectric layer 233 may appropriately contain additive materials acting as accessory components so that a characteristic of the dielectric layer 233 is controlled.

The insulating layer 22 is formed between the conducting interconnection layer 21 and the thin film electronic component 23. A material of the insulating layer is not particularly limited as long as it is an insulating material, but may use, for instance, a resin (a polyimide resin, an epoxy resin, an acrylic resin, a phenolic resin, etc.) as a main component. An insulating or high electrical resistance filler may be mixed inside the insulating layer 22. Thereby, mechanical strength of the insulating layer 22 can be enhanced. The insulating layer 22 is disposed to fill a space between the conducting interconnection layer 21 and the thin film electronic component 23 in addition to a gap between two neighboring thin film electronic components 23.

The thin film electronic component 23 is configured such that the first electrode layer 231 of the one side thereof is exposed to a surface of the thin film component sheet 20, and forms a flat surface along with another material that is exposed to the main surface of the one side of the thin film component sheet 20. The thin film component sheet 20 shown in FIG. 1 is formed such that a position in a height direction of a Main surface 231a of a shown upper side of the first electrode layer 231 and a position of an end face 22a of a shown upper side of the insulating layer 22 are roughly the same. As a result, a main surface 201 of a shown upper side of the thin film component sheet 20 is a flat surface.

A main surface 202 of a shown lower side of the thin film component sheet 20 is formed such that a position in a height direction of a main surface 21b of one side (a shown lower side) of the conducting interconnection layer 21 and a position of an end face 22b of a shown lower side of the insulating layer 22 are substantially the same. As a result, the main surface 202 of the shown lower side of the thin film component sheet 20 is a flat surface.

Figure 2:
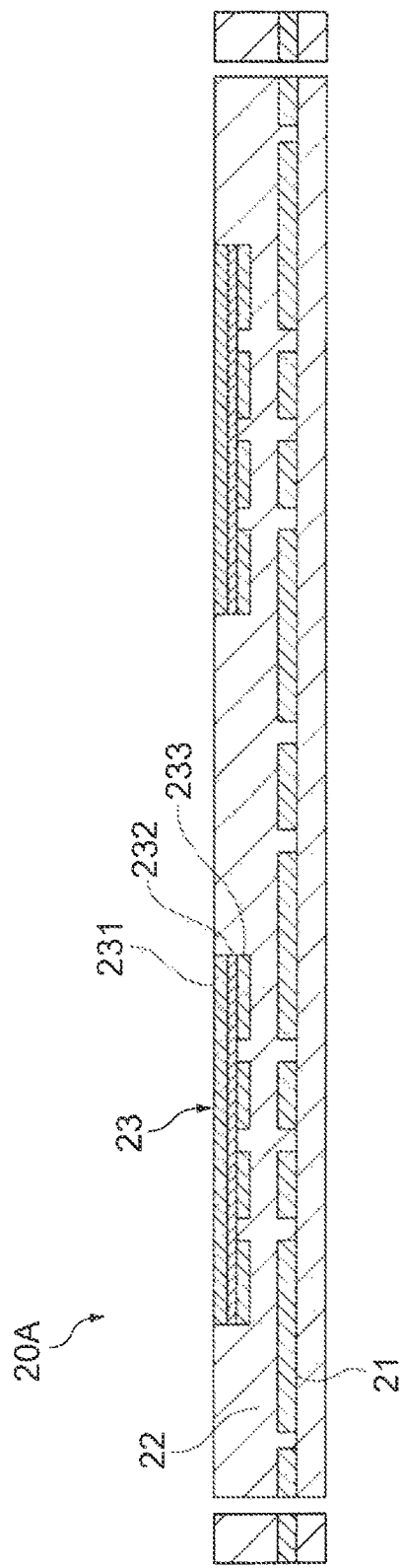
FIG. 2 is a schematic sectional view of a thin film component sheet according to an embodiment of the present invention.

A thin film component sheet 20A having a different configuration than the thin film component sheet 20 shown in FIG. 1 is shown in FIG. 2. The thin film component sheet 20A is similar to the thin film component sheet 20 in that it has the conducting interconnection layer 21, the insulating layer 22, and the thin film electronic component 23, but is different from the thin film component sheet 20 in that the conducting interconnection layer 21 is formed in the insulating layer 22. In this way, an arrangement of the conducting interconnection layer 21 can be appropriately changed. Like the thin film component sheet 20A of FIG. 2, when the conducting interconnection layer 21 is formed in the insulating layer 22, the main surface 202 of the opposite side of the main surface 201 located at the side to which the thin film electronic component 23 is exposed in the thin film component sheet 20A is formed by the insulating layer 22.

Layers other than the insulating layer 22 may be exposed to the main surface 201 located at the side to which the thin film electronic component 23 is exposed in the thin film component sheet 20A. As the other layer, for example a metal layer may be used. This point will be described below. An electrode layer of the thin film electronic component 23 is exposed to a main surface of one side, and the exposed surface of the electrode layer forms a part of a flat surface in the main surface, which is common to any case.

Returning to FIG. 1, the interconnection layers 30 and 40 and the through-hole vias 50 of the board 2 with built-in electronic component will be described. The interconnection layer 30 is disposed at the shown upper side of the thin film component sheet 20 and is configured such that a plurality of conductor layers 31 formed of a conductive material and a plurality of insulating layers 32 formed of an insulating material are alternately laminated, and a plurality of vias 33 are formed of a conductive material and electrically connect the plurality of conductor layers 31. Terminal parts 34 formed of a conductive material similarly to the conductor layers 31 are disposed at ends of the uppermost vias 33, and the bumps 4 are formed on the terminal parts 34.

The interconnection layer 40 is disposed at the shown lower side of the core board 10 (at the opposite side of the side at which the thin film component sheet 20 is laminated) and is configured such that a plurality of conductor layers 41 formed of a conductive material and a plurality of insulating layer 42 formed of an insulating material are alternately laminated, and a plurality of vias 43 formed of a conductive material and electrically connect the plurality of conductor layers 41 are formed. Terminal parts 44 formed of a conductive material similarly to the conductor layers 41 are disposed at ends of the uppermost vias 43.

The through-hole vias 50 pass through the core board 10 and the thin film component sheet 20 and connect the upper interconnection layer 30 and the lower interconnection layer 40. A part of the through-hole via 50 passes through some of the insulating layers 32 of the interconnection layer 30 and some of the insulating layer 42 of the interconnection layer 40 and electrically connects the vias 33 of the interconnection layer 30 and the vias 43 of the interconnection layer 40.

Structures of the interconnection layers 30 and 40 are appropriately changed depending on specifications or the like required for the board 2 with built-in electronic component. In addition, depending on the specifications or the like required for the board 2 with built-in electronic component, the number of layers laminated for the conductor layers 31 and the insulating layers 32 in the interconnection layer 30 and the number of layers laminated for the conductor layers 41 and the insulating layer 42 in the interconnection layer 40 are also appropriately changed.

The above board 2 with built-in electronic component has a thickness of about 20 μm to 1.5 mm. A thickness of the core board 10 is not particularly limited, but may be set to, for instance, a range from about 1 μm to 1 mm. When the core board 10 has the RCC structure, a thickness of the copper foil may range from about 5 μm to 250 μm. Even when the core board 10 is used as a conductor layer, a thickness thereof may be set to the range from about 5 μm to 250 μm. A thickness of the thin film component sheet 20 on the core board 10 is not particularly limited, but may be set to, for instance, a range from about 5 μm to 1 mm. In addition, a thickness of the thin film electronic component 23 mounted on the thin film component sheet 20 may be set to a range from about 5 μm to 200 μm. Thicknesses of the first electrode layer 231 and the second electrode layer 232 may be set to a range from about 2 μm to 50 μm. A thickness of the dielectric layer 233 may be set to a range from about 1 μm to 100 μm.

As illustrated in FIGS. 1 and 2, the second electrode layer 232 of the present embodiment is patterned, but this patterning may be performed at a side of the first electrode layer 231 or at opposite sides of the electrode layer. In any mode, partial removal of the electrode layer in the patterning is preferably performed at a portion at which the electrode layer is not removed in the electrode layer of the opposite side via the dielectric layer 233. Due to this structure, mechanical strengths of the thin film electronic component 23 and the thin film component sheet 20 are enhanced, and handling is improved to some extent. However, as described above, the thin film component sheet 20 is a sheet that deals with a so-called "thin film electronic component" in which the thickness of the thin film electronic component 23 is extremely thin. This thin film electronic component has flexibility and can be bent, and it still has a problem with handleability due to the thinness thereof.

When a thin film electronic component has been mounted in the board 2 with built-in electronic component so far, it has been manufactured using a method of manufacturing a sheet-like thin film electronic component having a size corresponding to a size of the board when the board was manufactured, adhering the thin film electronic component to the board, then partitioning the thin film electronic component from other areas by patterning or the like, and thereby settling an area that functions as the electronic component. However, when this method is adopted, a material of the electronic component such as an electrode layer or a dielectric layer is used in addition to the area used as the electronic component. Therefore, it is conceivable that a cost of the board with built-in electronic component will be increased. Meanwhile, since, as described above, the handling is difficult, even though individual pieces of the electronic component corresponding to the area used as the electronic component can be previously prepared, it is particularly difficult to accurately arrange the individual pieces at designated positions on the board. When the electronic component cannot be accurately arranged, electric connection with other conductor layers or the like cannot be reliably performed, and thus there is concern over a drop in yield. Therefore, a method of adhering individually divided electronic components to specified positions on a board is not realistic.

In contrast, the thin film component sheet 20 used for the board 2 with built-in electronic component according to the present embodiment solves the problem, suppresses cost, and has excellent handleability. In the thin film component sheet 20, since the thin film electronic component 23 is arranged at a pre-specified position, alignment may be performed on the basis of the thin film component sheet 20 when the board with built-in electronic component is manufactured, and it is unnecessary to individually position the electronic component. Therefore, the thin film component sheet 20 is a sheet that cannot prevent a drop in yield because the positioning of the electronic component can be properly performed.

(Method of Manufacturing Thin Film Component Sheet)

Next, a method of manufacturing a thin film component sheet will be described with reference to FIGS. 3A to 7G. The method of manufacturing a thin film component sheet roughly includes a thin film electronic component preparing process of preparing a carrier sheet to which a plurality of thin film electronic components are adhered, a thin film electronic component embedding process of pressing the carrier sheet, to which the thin film electronic components are adhered, against an insulating layer of an interconnection structure, in which an interconnection layer and the insulating layer are laminated, to embed the thin film electronic components into the insulating layer and form a flat surface of a main surface of one side of a thin film component sheet, and a sheet removing process of removing the carrier sheet to expose a main surface of one electrode layer of the plurality of thin film electronic components to the outside on the main surface of the one side of the thin film component sheet. However, the method of manufacturing a thin film component sheet can be appropriately changed. As the manufacturing method differs, a portion, at which a structure of a thin film component sheet also differs, is generated, Hereinafter, four methods manufacturing a thin film component sheet will be sequentially described, and structural features of the thin film component sheet made by each of the manufacturing methods will also be described.

(Method of Manufacturing Thin Film Component Sheet: First Method)

FIGS. 3A to 3D are views illustrating a first manufacturing method related to the thin film component sheet. The first manufacturing method has a feature in which a positioning of an electronic component is performed using a carrier sheet, a jig plate, and pins. In the first manufacturing method, since the positioning of the electronic component is performed using the pins, through-holes by which the positioning using the pins is possible are provided in a thickness direction of the electronic component in the electronic component.

First, as illustrated in FIG. 3A, thin film electronic components 23 are placed on a carrier sheet 52 fixed to a jig plate 51. Pieces of the thin film electronic components 23 are previously prepared. That is, a dielectric layer 233 is provided between a pair of first and second electrode layers 231 and 232. Further, individual pieces cut in a desired size are prepared.

The carrier sheet 52 is a sheet-like material used for the positioning and adhesion of the electronic component, and can use, for instance, a PET film or the like. A foamed resin layer 53 acting as a temporary adhering material is previously provided on a surface of the carrier sheet 52, and the thin film electronic components 23 are adhered to the foamed resin layer 53. In this step, the carrier sheet 52 and the foamed resin layer 53 enter into a mutually bonded state. In place of the foamed resin layer 53, a glue layer or a hot-melt adhesive layer such as fatty acid glyceride may be provided. That is, the foamed resin layer 53 or the like may not be provided as long as the carrier sheet 52 and the thin film electronic components 23 are configured to be separatable due to any stimulus such as heat while the thin film electronic components 23 can be bonded to the carrier sheet 52.

Through-holes 511, 521, and 531 and through-holes 512, 522, and 532, which extend in a thickness direction, are provided in the jig plate 51, the carrier sheet 52, and the foamed resin layer 53, and a plurality of pins 61 and 62 passing through the through-holes are inserted into the through-holes. The through-holes 511, 521, and 531 communicate with each other, and the through-holes 512, 522, and 532 communicate with each other. The pins 61 are used to perform alignment of the jig plate 51 and the carrier sheet 52 (and the foamed resin layer 53 bonded to the carrier sheet 52). Meanwhile, the pins 62 are used to perform the alignment of the jig plate 51 and the carrier sheet 52 (and the foamed resin layer 53 bonded to the carrier sheet 52) as well as the positioning of the thin film electronic components 23 placed on the foamed resin layer 53. Through-holes 234, which pass through the first electrode layer 231, the second electrode layer 232, and the dielectric layer 233 and extend in the thickness direction, are previously provided in the thin film electronic components 23 used in the first manufacturing method. Positions at which the through-holes 234 are provided in the thin film electronic components 23 are designated depending on an arrangement of the pins 62, and are formed at desired positions by laser processing, mechanical drilling, or wet blast processing.

The positioning of the thin film electronic components 23 with respect to the carrier sheet 52 (and the foamed resin layer 53 bonded to the carrier sheet 52) positioned with respect to the jig plate 51 by the pins 61 and 62 is performed using the pins 62. The thin film electronic components 23 are adhered to the foamed resin layer 53 on the carrier sheet 52 to integrate the thin film electronic components 23, the carrier sheet 52, and the foamed resin layer 53. On this occasion, the thin film electronic components 23 are adhered such that the first electrode layer 231 of a side on which a main surface of the thin film component sheet 20 is formed is bonded to the foamed resin layer 53.

The plurality of thin film electronic components 23 are separated and arranged at given intervals. However, the interval between the thin film electronic components 23 is different according to whether or not cutting is performed between the thin film electronic components 23. When cutting is performed, the interval between the thin film electronic components 23 is preferably set to a range from 80 µm to 120 µm. In the case of this interval, the cutting can be performed without damaging the thin film electronic components 23. When cutting is not performed, an interval of about 5 µm to 8 µm may be provided. The interval of this level is provided so that a short circuit between the thin film electronic components 23 can be provided. Even when the interval between the thin film electronic components 23 is set to be wide from the viewpoint of safety during processing, the interval is preferably suppressed to be about two times a thickness of the thin film component sheet 20, namely, to about 2 mm at most. When the interval exceeds two times the thickness of the thin film component sheet 20, there is a tendency for handling of the thin film component sheet 20 to become difficult.

Next, as illustrated in FIG. 3B, the carrier sheet 52 to which the thin film electronic components 23 are adhered via the foamed resin layer 53 is removed from the jig plate 51 and the pins 61 and 62, and the arrangement in a vertical direction is reversed. Apart from the through-holes 234 of the thin film electronic components 23, the through-holes 521 and 531 communicating with the carrier sheet 52 and the foamed resin layer 53 and the through-holes 522 and 532 communicating with the through-holes 234 of the thin film electronic components 23 are formed in the carrier sheet 52 and the foamed resin layer 53 after the pins 61 and 62 are removed. As illustrated in FIG. 3B, after the vertical direction is reversed, the second electrode layer 232 of each of the thin film electronic components 23 enters into a state in which a lower portion thereof is exposed.

Next, as illustrated in FIG. 3C, the carrier sheet 52 to which the thin film electronic components 23 are adhered via the foamed resin layer 53 is pressed against an interconnection structure 25 formed of the conducting interconnection layer 21 and the insulating layer 22 to embed the thin film electronic components 23 in the insulating layer 22. The interconnection structure 25 is a so-called buildup film, is configured such that the conducting interconnection layer 21 and the insulating layer 22 are integrated in advance, and can be manufactured by a well-known method. When the thicknesses of the first and second electrode layers 231 and 232 of each of the thin film electronic components 23 range from about 2 µm to 50 µm, the thickness of the conducting interconnection layer 21 preferably ranges from 5 µm to 30 µm. The thickness of the conducting interconnection layer 21 is set to substantially the same level as the thickness of the electrode layer of each of the thin film electronic components 23. Accordingly, electric properties of the conducting interconnection layer 21 can be set to be substantially the same as those of the electrode layer of each of the thin film electronic components 23, and sufficient strength can be given to the thin film component sheet 20 at the same time. The conducting interconnection layer 21 can be patterned and used.

Through-holes (second through-holes) 251 are provided in the interconnection structure 25. In addition, pins 63 are mounted on a press plate 54 used to embed the thin film electronic components 23 in the insulating layer 22, and the carrier sheet 52 is mounted on the press plate 54 such that the pins 63 are inserted into the through-holes 521 of the carrier sheet 52 and the through-holes 531 of the foamed resin layer 53. In this state, the press plate 54, on which the carrier sheet 52 is mounted, and the interconnection structure 25 are combined such that the pins 63 are inserted into the through-holes 251 of the interconnection structure 25. On this occasion, the thin film electronic components 23 are embedded in the insulating layer 22 in a state in which second electrode layers 232 of the thin film electronic components 23 face the insulating layer 22 of the interconnection structure 25. The thin film electronic components 23 and the interconnection structure 25 are pressed by the press plate 54 until a thickness of the interconnection structure 25 becomes a desired thickness of the thin film component sheet, and thereby the thin film electronic components 23 and the interconnection structure 25 are integrated. Pressing conditions based on the press plate 54 can be appropriately changed depending on a material of the insulating layer 22, a material of the thin film electronic components 23, or the like. Pressure may be reduced or heat may be applied during pressing.

Finally, after the press plate 54 and the pins 63 are removed, the foamed resin layer 53 is foamed using heating or the like to peel the thin film electronic components 23 from the carrier sheet 52 and the foamed resin layer 53. As a result, a thin film component sheet 20B as illustrated in FIG. 3D) is obtained. In the thin film component sheet 20B, the second electrode layers 232 of the thin film electronic components 23 are embedded therein, and first electrode layers 231 are exposed to the outside. In the thin film component sheet 20B, a flat surface on which the end face 22a of the upper side of the insulating layer 22 and the main surface 231a of the upper side of the first electrode layer 231 of each of the thin film electronic components 23 are continuous is formed as a result of pressing from the press plate 54.

The thin film component sheet 20B manufactured by the first method has the following features. That is, as described above, the positioning between the carrier sheet 52 and the thin film electronic components 23 and between the foamed resin layer 53 and the thin film electronic components 23 is performed using the pins 62. To this end, the through-holes 234 are formed in the thin film electronic components 23. Since the through-holes 234 are embedded in a state in which they face the insulating layer 22 as illustrated in FIG. 3D) when combined with the interconnection structure 25, the insulating material of the insulating layer 22 also enters into the through-holes 234 and can also reach above the through-holes 234, namely above the through-holes 522 of the carrier sheet 52 and the through-holes 532 of the foamed resin layer 53. Therefore, after the carrier sheet 52 and the foamed resin layer 53 are removed, recesses 221 through which the insulating material protrudes from the through-holes 234 provided in the thin film electronic components 23 may be formed. In this way, in a mode in which the insulating material is filled in the through-holes 234, peeling between the thin film electronic component 23 and the insulating layer 22 can be effectively suppressed, and handleability of the thin film component sheet 20B is further improved. The recesses 221 may also not be formed in the through-holes 234. However, when the thin film electronic components 23 are embedded in the insulating layer 22, it is conceivable that there is a high possibility of the recesses 221 being formed together because the insulating material of the insulating layer 22 is preferably filled in the through-holes 234. In this way, the recesses 221 from which insulating material inside the through-holes 234 protrudes are formed, and thereby adhesion strength when the thin film component sheet 20B is used in a board with built-in electronic component is further improved.

A thickness of the insulating layer 22 at a portion at which the thin film electronic components 23 (the second electrode layers 232) face the conducting interconnection layer 21 can be set to the range of 5 µm to 40 µm. In this way, since the thickness of the insulating layer 22 is set to substantially the same level as the thickness of the electrode layer of each of the thin film electronic components 23, a shear force easily occurring at the insulating layer 22 is more easily absorbed by each of the electrode layers when the thin film component sheet 20 is handled, and sufficient strength can be given to the thin film component sheet 20.

In the first method, the positioning is performed using the pins 63 even when the carrier sheet 52 and the interconnection structure 25 including the thin film electronic components 23 are integrated. Therefore, the through-holes 251 (the second through-holes) into which the pins 63 are inserted remain in the thin film component sheet 20B manufactured by the first method. As the thin film component sheet 20B has the through-holes 251, positioning and fixing of the thin film component sheet 20B are facilitated. Even if strain occurs when the thin film component sheet 20B is handled, the strain can be absorbed by the through-holes 251, and thus the handleability of the thin film component sheet 20B is further improved.

In this way, according to the first method, since the positioning of the electronic components when the thin film component sheet is manufactured can be performed using the pins 61, 62 and 63 provided for the jig plate 51 and the press plate 54, the positioning can be performed in a proper and easy way. In the thin film component sheet 20B manufactured by the first method, since the portions other than the thin film electronic components 23 and the conducting interconnection layer 21 can be formed by the insulating layer 22, a thin film component sheet having high positioning accuracy in relation to electronic components can be less expensively manufactured.

(Method of Manufacturing Thin Film Component Sheet: Second Method)

FIGS. 4A to 4E and 5A to 5G are views illustrating a second manufacturing method related to the thin film component sheet. In the second manufacturing method, a method of manufacturing an electronic component divided into individual pieces is different from the first manufacturing method. That is, in the first manufacturing method, individually divided electronic components are adhered to a carrier sheet. However, in the second manufacturing method, after each layer constituting an electronic component is laminated on a support plate, each support plate is divided into individual pieces to manufacture individual pieces of the electronic component. The support plate is not particularly limited, but can use, for instance, a glass plate or a resin material.

Figure 4A:
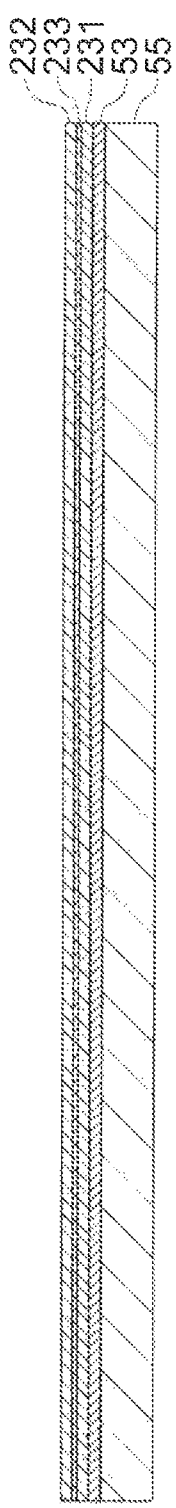

First, as illustrated in FIG. 4A, a first electrode layer 231, a dielectric layer 233, and a second electrode layer 232 are sequentially laminated on a support plate 55 via a foamed resin layer 53. Here, the first electrode layer 231 is laminated directly on the foamed resin layer 53, and the second electrode layer 232 is laminated at a highest position. When a thin film component sheet is manufactured by the second manufacturing method, at least one of the first electrode layer 231 and the second electrode layer 232 needs to be magnetic.

Figure 4B:
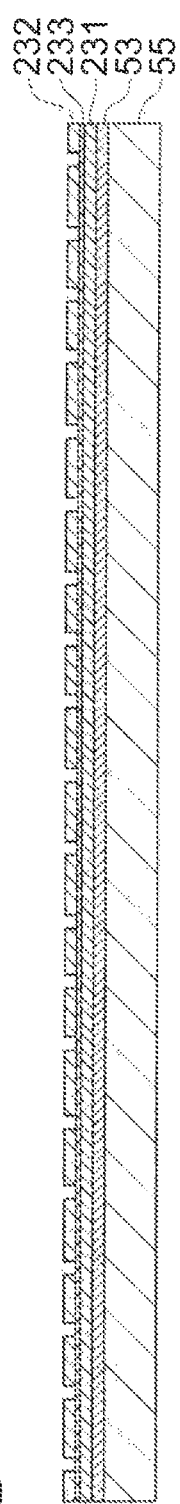

Next, as illustrated in FIG. 4B, patterning is performed on the second electrode layer 232, and thereby a desired pattern is formed on the second electrode layer 232.

Figure 4C:
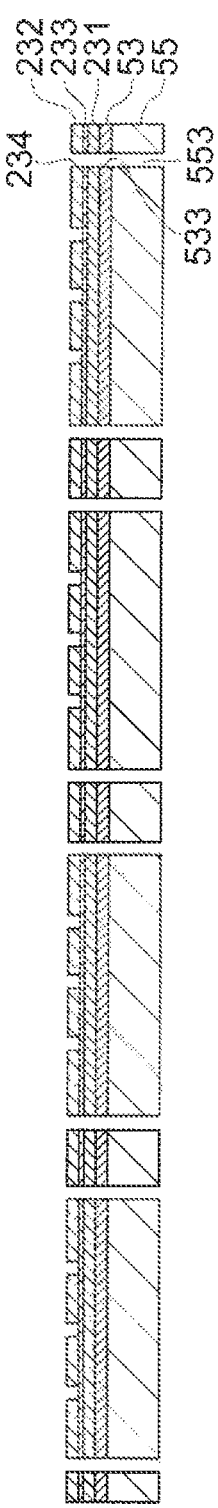

Next, as illustrated in FIG. 4C, through-holes 234 passing through the second electrode layer 232, the dielectric layer 233, and the first electrode layer 231, through-holes 533 of a foamed resin layer 53, and through-holes 553 of the support plate 55 are formed by laser processing, mechanical drilling, or wet blast processing. The through-holes 234, 533, and 553 are continuous through-holes. Positions at which the through-holes 234, 533, and 553 are provided are set depending on a position of an electronic component in the thin film component sheet.

Next, as illustrated in FIG. 4D, the support plate 55 and the thin film electronic component 23 are divided into individual pieces. A method of dividing the support plate 55 and the thin film electronic component 23 into individual pieces is not particularly limited, but can use, for instance, dicing.

As a result, as illustrated in FIG. 4E, individual pieces of thin film electronic components 23 are laminated on support plates 55 and foamed resin layers 53, each of which has a shape corresponding to each of the thin film electronic components 23, and are thereby formed into the thin film electronic components 23 with support plates 55. When compared to a case in which the individual pieces of the thin film electronic components 23 are handled as simple bodies, the thin film electronic components 23 with the support plates 55 manufactured by the above method have excellent handleability because rigidity thereof is held by the support plates 55. For this reason, the thin film electronic components 23 with the support plates 55 can be operated in units of the individual piece.

Figure 5A:
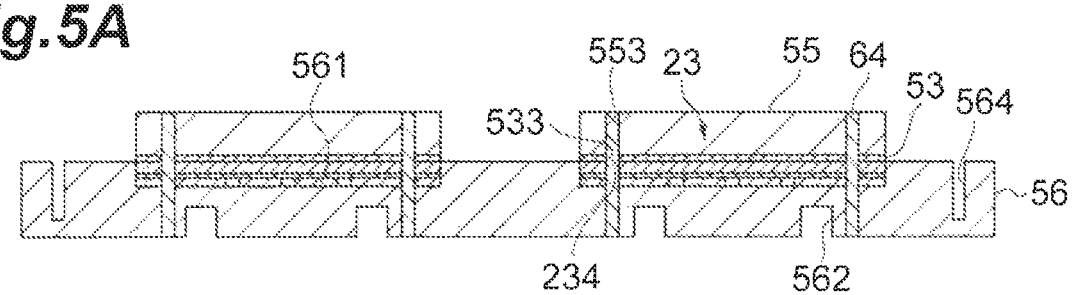
FIGS. 5A, 5B, 5C, 5D, 5E, 5F, and 5G are views illustrating the method of manufacturing the thin film component sheet (the second method).

Next, as illustrated in FIG. 5A, the thin film electronic components 23 with the support plates 55 are mounted on a jig plate 56 for alignment. The jig plate 56 for alignment has a width corresponding to a board with built-in electronic component, and has recesses 561 with depths corresponding to heights of the thin film electronic components 23 in a main surface of one side thereof at positions corresponding to mounting positions of the thin film electronic components 23 in the board with built-in electronic component. In addition, the jig plate 56 has a plurality of recesses 562 provided in a main surface thereof which is opposite to the main surface thereof in which the recesses 561 are provided at positions opposite to the recesses 561.

Further, through-holes 563 passing through the jig plate 56 for alignment are provided in the recesses 561 of the jig plate 56 for alignment, and pins 64 for alignment are inserted into the through-holes 563. Recesses 564 for alignment are also provided at different positions than the recesses 561.

The thin film electronic components 23 with the support plates 55 are mounted on the jig plate 56 for alignment. To be specific, the thin film electronic components 23 of the thin film electronic components 23 with the support plates 55 are mounted in a state in which they face the recesses 561 such that the pins 64 pass through the through-holes 234, 533, and 553 of the thin film electronic components 23 with the support plates 55. Even when the recesses 561 are configured to be slightly larger than the thin film electronic components 23 in consideration of a clearance between the recess 561 and the thin film electronic component 23, the thin film electronic components 23 can be accurately arranged on the jig plate 56 for alignment at desired positions because the pins 64 position the thin film electronic components 23 with the support plates 55.

Figure 5B:
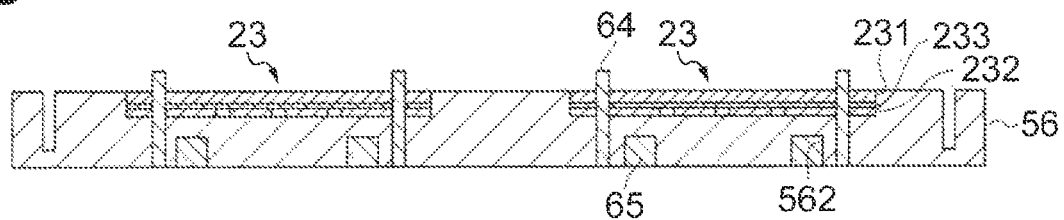

Next, as illustrated in FIG. 5B, after magnets 65 are mounted in the recesses 562 of the surface of the opposite side, the thin film electronic components 23 are removed from the support plates 55 and the foamed resin layers 53 by foaming the foamed resin layers 53. In a state in which the first electrode layer 231 and/or the second electrode layer 232 of each of the thin film electronic components 23 and the magnets 65 are attracted by a magnetic force, the support plates 55 and the foamed resin layers 53 are removed. Thus, a misalignment of the thin film electronic components 23 caused by the removal can be prevented. For this reason, each material is preferably selected such that an attractive force between the first electrode layer 231 and/or the second electrode layer 232 and the magnets 65 is increased.

Figure 5C:
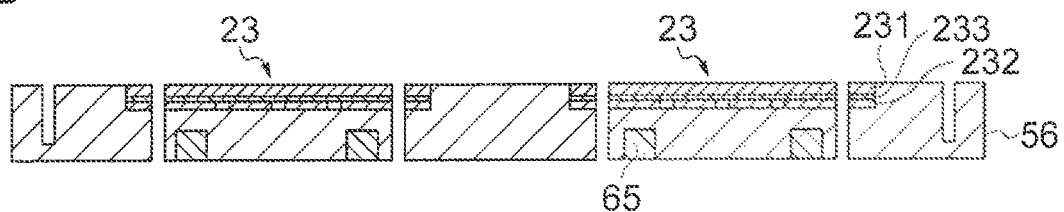
Figure 5D:
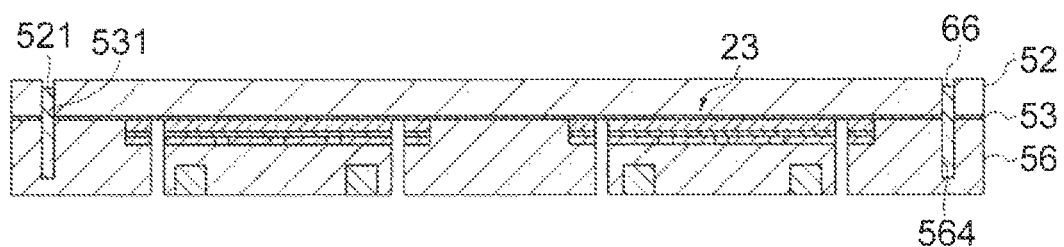

Subsequently, as illustrated in FIG. 5C, the pins 64 are removed from the jig plate 56 for alignment, Here, since the attractive force caused by the magnetic force between the first electrode layer 231 and/or the second electrode layer 232 of each of the thin film electronic components 23 and the magnets 65 occurs, the positions of the thin film electronic components 23 can be held despite the pins 64 being removed. In this way, the magnets 65 are used to appropriately maintain the positions of the thin film electronic components 23.

Next, as illustrated in FIG. 5I), the foamed resin layer 53 and the carrier sheet 52 are laminated on the thin film electronic components 23. On this occasion, in a state in which pins 66 are inserted into the recesses 564 of the jig plate 56 for alignment, alignment of the foamed resin layer 53 and the carrier sheet 52 can be performed on the thin film electronic components 23 because the foamed resin layer 53 and the carrier sheet 52 are laminated such that the pins 66 are inserted into the through-holes 531 of the foamed resin layer 53 and the through-holes 521 of the and carrier sheet 52. The carrier sheet 52 and the foamed resin layer 53 are mutually bonded to be integrated, and the foamed resin layer 53 and the thin film electronic components 23 are mutually bonded to be integrated.

Figure 5E:
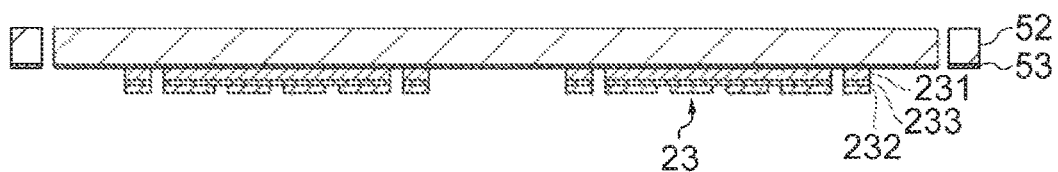

Next, as illustrated in FIG. 5E, the jig plate 56 for alignment and the pins 66 are removed, and the carrier sheet 52 to which the thin film electronic components 23 are adhered via the foamed resin layer 53 is obtained. On this occasion, the second electrode layer 232 of each of the thin film electronic components 23 enters into a state in which a lower portion thereof is exposed.

Figure 5F:
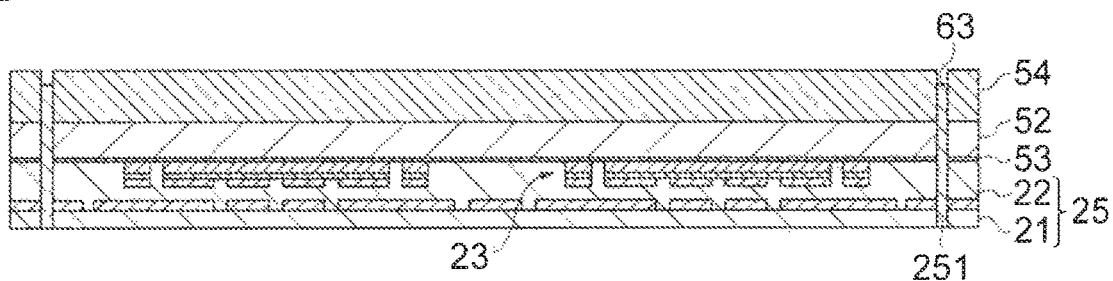

Next, as illustrated in FIG. 5F, the carrier sheet 52 to which the thin film electronic components 23 are adhered via the foamed resin layer 53 is pressed against the interconnection structure 25 formed of the conducting interconnection layer 21 and the insulating layer 22 to embed the thin film electronic components 23 in the insulating layer 22. This process is the same as the first manufacturing method. That is, the carrier sheet 52 is mounted on the press plate 54 such that the pins 63, which are provided at the press plate 54 used to embed the thin film electronic components 23 in the insulating layer 22, are inserted into the through-holes 521 of the carrier sheet 52 and the through-holes 531 of the foamed resin layer 53. In this state, the press plate 54 on which the carrier sheet 52 is mounted and the interconnection structure 25 are combined such that the pins 63 are inserted into the through-holes 251 of the interconnection structure 25. As a result, the thin film electronic components 23 are embedded in the insulating layer 22 in a state in which the second electrode layers 232 of the thin film electronic components 23 face the insulating layer 22 of the interconnection structure 25. The thin film electronic components 23 and the interconnection structure 25 are pressed by the press plate 54 until a thickness of the interconnection structure 25 becomes a desired thickness of the thin film component sheet, and thereby the thin film electronic components 23 and the interconnection structure 25 are integrated. Pressing conditions based on the press plate 54 can be appropriately changed depending on a material of the insulating layer 22, a material of the thin film electronic components 23, or the like, Pressure may be reduced or heat may be applied during pressing.

Figure 5G:
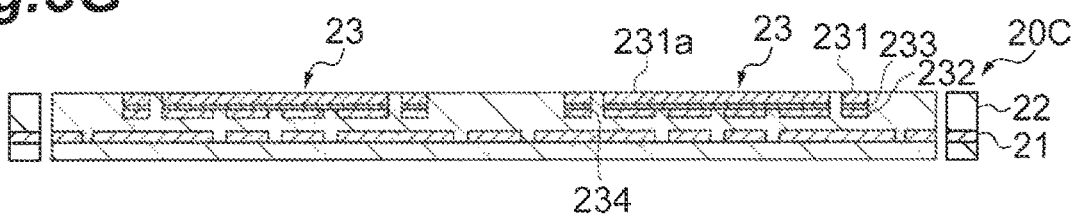

Finally, after the press plate 54 and the pins 63 are removed, the foamed resin layer 53 is foamed using heating or the like to peel the thin film electronic components 23 from the carrier sheet 52 and the foamed resin layer 53. As a result, a thin film component sheet 20C as illustrated in FIG. 5G is obtained. In the thin film component sheet 20C, the second electrode layers 232 of the thin film electronic components 23 are embedded therein, and the first electrode layers 231 are exposed to the outside. In the thin film component sheet 20C, a flat surface on which an end face 22a of the upper side of the insulating layer 22 and a main surface 231a of the upper side of the first electrode layer 231 of each of the thin film electronic components 23 are continuous is formed as a result of pressing from the press plate 54.

The thin film component sheet 20C manufactured by the second method has the following features. That is, as described above, the positioning between the carrier sheet 52 and the thin film electronic components 23 and between the foamed resin layer 53 and the thin film electronic components 23 is performed using the pins 62. To this end, the through-holes 234 are formed in the thin film electronic components 23. Since the through-holes 234 are embedded in the state in which they face the insulating layer 22 as illustrated in FIG. 5F when combined with the interconnection structure 25, the insulating material of the insulating layer 22 also enters into the through-holes 234. However, unlike the thin film component sheet 20B, since ends of the through-holes 234 are blocked by the foamed resin layer 53, no insulating material protrudes upward from the through-holes 234. Therefore, after the carrier sheet 52 and the foamed resin layer 53 are removed, insulating material inside the through-holes 234 provided in the thin film electronic components 23 forms a flat surface that is continuous with the main surface 231a of the upper side of the first electrode layer 231 of each of the thin film electronic components 23.

In the second method, the positioning is also performed using the pins 63 when the carrier sheet 52 and the interconnection structure 25 including the thin film electronic components 23 are integrated. Therefore, the through-holes 251 into which the pins 63 are inserted remain in the thin film component sheet 20C manufactured by the second method.

In this way, according to the second method, since the positioning of the electronic components when the thin film component sheet is manufactured can be performed using the pins 63, 64 and 66 provided in the jig plate 56 for alignment and the press plate 54 and the magnets 65 mounted on the jig plate 56 for alignment, the positioning can be performed in a proper and easy way. In the thin film component sheet 20C manufactured by the second method, since the portions other than the thin film electronic components 23 and the conducting interconnection layer 21 can be formed by the insulating layer 22, a thin film component sheet having high positioning accuracy in relation to electronic components can be more inexpensively manufactured. Further, when compared to the first method, the second Method has a feature in that the insulating material inside the through-holes 234 can be formed to be flat.

(Method of Manufacturing Thin Film Component Sheet: Third Method)

FIGS. 6A to 6G are views illustrating a third manufacturing method related to the thin film component sheet. Like the second manufacturing method, in the third manufacturing method, a thin film component sheet is manufactured using thin film electronic components 23 with support plates 55. However, since a configuration of the thin film component sheet is partially different, a description including this point will be made. Since a method of manufacturing the thin film electronic components 23 with the support plates 55 is the same as the second method described in FIG. 4, a description thereof will be omitted. Even when the thin film component sheet is manufactured by the third manufacturing method, at least one of a first electrode layer 231 and a second electrode layer 232 needs to be magnetic.

Figure 6A:
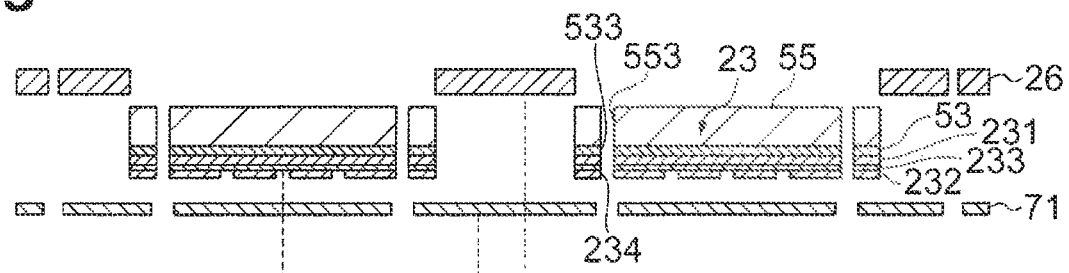
FIGS. 6A, 6B, 6C, 6D, 6E, 6F, and 6G are views illustrating a method of manufacturing the thin film component sheet (a third method).
Figure 6B:
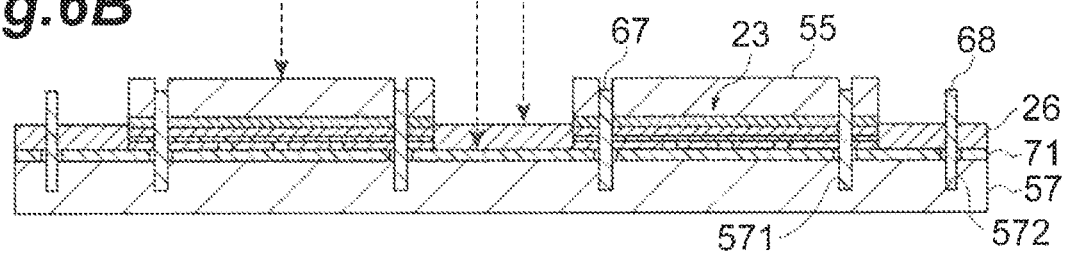

First, as illustrated in FIGS. 6A and 6B, the thin film electronic components 23 with the support plates 55 are mounted on a jig plate 57 for alignment. The jig plate 57 for alignment has a width corresponding to a board with built-in electronic component, and has recesses 571 in which pins 67 for positioning the thin film electronic components 23 are mounted, and which are provided in a main surface of one side thereof at positions corresponding to mounting positions of the thin film electronic components 23 in the board with built-in electronic component. In addition, recesses 572 in which pins 68 for performing alignment of a carrier sheet are mounted are also provided in the jig plate 57 for alignment. The jig plate 57 for alignment is made to be flat on an area other than the recesses 571 and 572, which is different from the jig plate 56 for alignment used in the second method.

First, after a magnetic sheet 71 is laid on an entire surface excepting the recesses 571 and 572, the thin film electronic components 23 with the support plates 55 are mounted on the jig plate 57 for alignment. To be specific, the thin film electronic components 23 are mounted in a state in which they face the magnetic sheet 71 such that the pins 67 pass through through-holes 234, 533 and 553 of the thin film electronic components 23 with the support plates 55.

A space between neighboring thin film electronic components 23 with the support plates 55 is filled by a magnetic material layer 26 that is different from the thin film electronic components 23. A layer whose main component is, for instance, copper (Cu) can be provided as the magnetic material layer 26, but the material of the magnetic material layer 26 is not particularly limited. However, the magnetic material layer 26 needs to be magnetic. A method of arranging the magnetic material layer 26 in the space between the neighboring thin film electronic components 23 with the support plates 55 is not particularly limited, but may use, for instance, a method such as sputtering. A thickness of the magnetic material layer 26 is not particularly limited, but is preferably less than or equal to a thickness of the thin film electronic component 23, and more preferably the same thickness as the thin film electronic component 23. When the thickness of the magnetic material layer 26 is greater than that of the thin film electronic component 23, misalignment or the like derived, from a difference in height position of upper surfaces thereof may occur when the thin film electronic components 23 are adhered to a carrier sheet 52. The magnetic material layer 26 is provided so that the positions of the neighboring thin film electronic components 23 can be maintained with higher accuracy. Since the magnetic material layer 26 is formed in a state in which the pins 68 are mounted on the jig plate 57 for alignment, through-holes 261 into which the pins 68 are inserted are formed in the magnetic material layer 26. The magnetic material layer 26 is preferably electrically insulated from the thin film electronic components 23. Breakdown of the thin film electronic component 23 caused by static electricity is easily avoided. For example, a means for coating a high electric resistance layer on the magnetic material layer 26 can be provided.

Figure 6C:
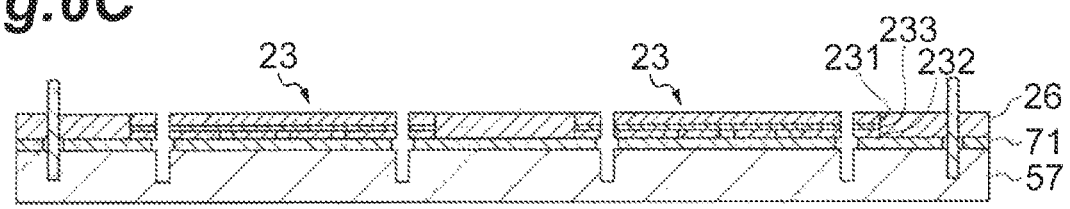

Next, as illustrated in FIG. 6C, the thin film electronic components 23 are removed from the support plates 55 and the foamed resin layers 53 by foaming the foamed resin layers 53. In addition, the pins 67 are also removed from the jig plate 57 for alignment. In a state in which the first electrode layer 231 and/or the second electrode layer 232 of each of the thin film electronic components 23 and the magnetic sheet 71 are attracted by a magnetic force, the support plates 55 and the foamed resin layers 53 are removed. Thus, a misalignment of the thin film electronic components 23 caused by the removal can be prevented. For this reason, each material is preferably selected such that an attractive force between the first electrode layer 231 and/or the second electrode layer 232 and the magnetic sheet 71 is increased. Likewise, since the magnetic material layer 26 that is attracted by the magnetic force along with the magnetic sheet 71 is provided between the neighboring thin film electronic components 23, the misalignment of the thin film electronic components 23 caused by the removal can be more appropriately prevented.

Figure 6D:
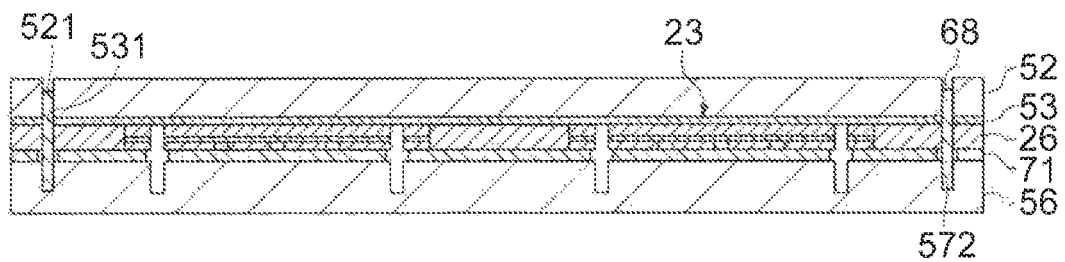

Next, as illustrated in FIG. 6D, the foamed resin layer 53 and the carrier sheet 52 are laminated on the thin film electronic components 23 and the magnetic material layer 26. On this occasion, in a state in which pins 68 are inserted into the recesses 572 of the jig plate 57 for alignment, alignment of the foamed resin layer 53 and the carrier sheet 52 can be performed on the thin film electronic components 23 and the magnetic material layer 26 because the foamed resin layer 53 and the carrier sheet 52 are laminated such that the pins 68 are inserted into the through-holes 531 of the foamed resin layer 53 and the through-holes 521 of the and carrier sheet 52. The carrier sheet 52 and the foamed resin layer 53 are mutually bonded to be integrated, and the foamed resin layer 53 and the thin film electronic components 23 or the magnetic material layer 26 are mutually bonded to be integrated.

Figure 6E:
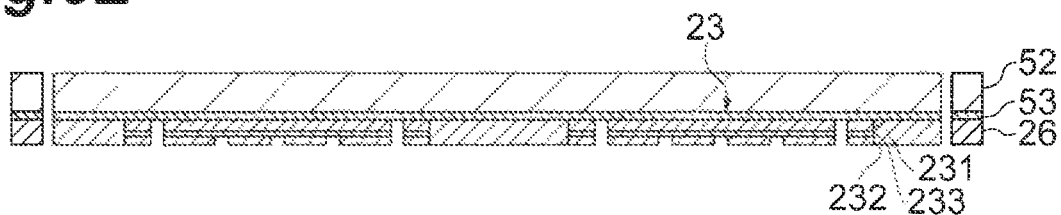

Next, as illustrated in FIG. 6E, the jig plate 57 for alignment, the pins 68, and the magnet sheet 71 are removed, the carrier sheet 52 to which the thin film electronic components 23 and the magnetic material layer 26 are adhered via the foamed resin layer 53 is obtained. On this occasion, the second electrode layer 232 of each of the thin film electronic components 23 and the magnetic material layer 26 enter into a state in which they are exposed at lower portions thereof.

Figure 6F:
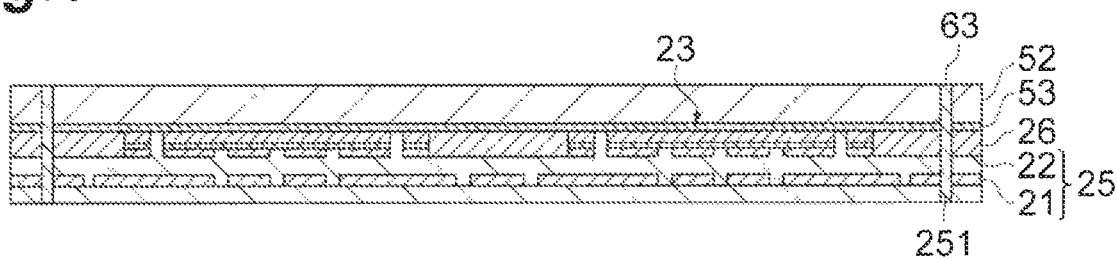

Next, as illustrated in FIG. 6F, the carrier sheet 52, to which the thin film electronic components 23 and the magnetic material layer 26 are adhered via the foamed resin layer 53, is pressed against an interconnection structure 25 formed of the conducting interconnection layer 21 and the insulating layer 22 to embed the thin film electronic components 23 and the magnetic material layer 26 in the insulating layer 22. Like the first and second manufacturing methods, the carrier sheet 52 is mounted on a press plate (not shown) such that pins 63, which are provided at the press plate used to embed the thin film electronic components 23 and the magnetic material layer 26 in the insulating layer 22, are inserted into the through-holes 521 of the carrier sheet 52, the through-holes 531 of the foamed resin layer 53, and the through-holes 261 of the magnetic material layer 26. In this state, the press plate and the interconnection structure 25 are combined such that the pins 63 are inserted into the through-holes 251 of the interconnection structure 25. As a result, the thin film electronic components 23 and the magnetic material layer 26 are embedded in the insulating layer 22 in a state in which the second electrode layers 232 of the thin film electronic components 23 face the insulating layer 22 of the interconnection structure 25. The thin film electronic components 23, the magnetic material layer 26, and the interconnection structure 25 are pressed by the press plate until a thickness of the interconnection structure 25 becomes a desired thickness of the thin film component sheet, and thereby the thin film electronic components 23, the magnetic material layer 26, and the interconnection structure 25 are integrated. Pressing conditions based on the press plate can be appropriately changed depending on a material of the insulating layer 22, a material of the thin film electronic components 23, or the like. Pressure may be reduced, or heat may be applied during pressing.

Figure 6G:
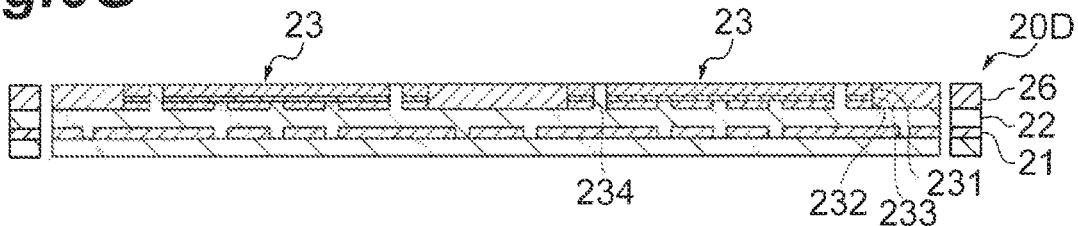

Finally, after the press plate and the pins 63 are removed, the foamed resin layer 53 is foamed using heating or the like to peel the thin film electronic components 23 and the magnetic material layer 26 from the carrier sheet 52 and the foamed resin layer 53. As a result, a thin film component sheet 20D as illustrated in FIG. 6G is obtained. In the thin film component sheet 20D, the second electrode layers 232 of the thin film electronic components 23 are embedded therein, and the first electrode layers 231 are exposed to the outside. In the thin film component sheet 20D, a flat surface on which an end face 26a of the upper side of the insulating layer 26 and a main surface 231a of the upper side of the first electrode layer 231 of each of the thin film electronic components 23 are continuous is formed as a result of pressing from the press plate.

The thin film component sheet 20D manufactured by the third method has the following features. That is, as described above, the positioning between the carrier sheet 52 and the thin film electronic components 23 and between the foamed resin layer 53 and the thin film electronic components 23 is performed using the pins 67. To this end, the through-holes 234 are formed in the thin film electronic components 23. Like the thin film component sheet 20C, since ends of the through-holes 234 are blocked by the foamed resin layer 53, no insulating material protrudes upward from the through-holes 234. Therefore, after the carrier sheet 52 and the foamed resin layer 53 are removed, insulating material inside the through-holes 234 provided in the thin film electronic components 23 forms a flat surface that is continuous with the main surface 231a of the upper side of the first electrode layer 231 of each of the thin film electronic components 23, which is the same as the thin film component sheet 20C.

In the third method, the positioning is also performed using the pins 63 when the carrier sheet 52 and the interconnection structure 25 including the thin film electronic components 23 are integrated. Therefore, the through-holes 251 and 261 into which the pins 63 are inserted remain in the thin film component sheet 20D manufactured by the third method.

Meanwhile, in the third method, since the magnetic material layer 26 is filled between the neighboring thin film electronic components 23, primary parts of a main surface of the thin film component sheet 20D to which the thin film electronic components 23 are exposed are formed by the thin film electronic components 23 and the magnetic material layer 26, which is different from the thin film component sheets 20 and 20A to 20C.

In this way, according to the third method, since the positioning of the electronic components when the thin film component sheet is manufactured can be performed using the pins 63, 67, and 68 provided in the jig plate 57 for alignment and the magnet sheet 71 mounted on the jig plate 57 for alignment, the positioning can be performed in a proper and easy way.

In the thin film component sheet 20D manufactured by the third method, the magnetic material layer 26 is filled between the neighboring thin film electronic components 23. In conventional electronic component sheets, an electrode layer and a dielectric layer are also provided at a position corresponding to the magnetic material layer 26. However, since these portions can be replaced with the magnetic material layer 26, a drop in cost is realized. In the thin film component sheet 20D in which the magnetic material layer 26 is filled between the neighboring thin film electronic components 23, since rigidity is increased at a position at which the magnetic material layer 26 is provided in comparison with other configurations in which an insulating material is provided thereat. Therefore, handleability as a sheet is improved. When the insulating material provided between the neighboring thin film electronic components 23 is a resin, there is a possibility that the resin is deformed by pressure or a temperature during processing or the like and flatness of the sheet is reduced. However, when the material provided between the neighboring thin film electronic components 23 is the magnetic material layer 26, an improvement in yield can be expected because deformation caused by pressure or a temperature is small.

Further, when a board with built-in electronic component is manufactured using the thin film component sheet 20D in which the magnetic material layer 26 is filled between the neighboring thin film electronic components 23, particularly when through-holes extending in the thickness direction like the through-hole vias 50 (see FIG. 1) are provided, laser processing is repetitively performed before and after the magnetic material layer 26. In this case, since hole diameters of the through-holes in the thickness direction are easily controlled, the number of processes is increased and dimensional accuracy can be improved.

(Method of Manufacturing Thin Film Component Sheet: Fourth Method)

FIGS. 7A to 7G are views illustrating a fourth manufacturing method related to the thin film component sheet. Unlike the first to third manufacturing methods, in the fourth manufacturing method, after positioning of electronic components on a carrier sheet is performed, patterning of the electronic components is performed. Since no pins are used for the positioning of the electronic components, no through-holes are provided in the electronic components, and this is also different from the other manufacturing methods.

First, as illustrated in FIG. 7A, a laminate of a support board 58 on a magnetic sheet 71 is prepared. The support board 58 can use, for instance, a glass epoxy board, but is not particularly limited. A magnetic material layer 28 is previously provided on the support board 58 at a position different from positions at which the electronic components are arranged. The magnetic material layer 28 can use, for instance, a copper foil or a copper foil with a carrier (a peelable copper foil), but is not limited to copper. However, the magnetic material layer 28 needs to be magnetic. Since the magnetic material layer 28 will be separated from the support board 58, when a peelable copper foil is used as the magnetic material layer 28, an operation is simplified. The magnetic material layer 28 is used to position the electronic components and becomes a part of the thin film component sheet. A second electrode layer 232, a dielectric layer 233, and a first electrode layer 231, which constitute each thin film electronic component layer 23A that functions as each thin film electronic component 23, are sequentially laminated on the support board 58 in each cell of the magnetic material layer 28. A preliminary laminate may be mounted on the support board 58 in each of the cells of the magnetic material layer 28. However, patterning related to the second electrode layer 232 is not performed in this step. When the thin film component sheet is manufactured by the fourth manufacturing method, at least one of the first electrode layer 231 and the second electrode layer 232 also needs to be magnetic.

Next, as illustrated in FIG. 7B, a foamed resin layer 53 and a carrier sheet 52 are laminated on the thin film electronic component layers 23A and the magnetic material layer 28. On this occasion, the magnetic sheet 71 is provided under the support board 58 to maintain a state in which misalignment related to the magnetic material layer 28 and the thin film electronic component layers 23A is prevented. The carrier sheet 52 and the foamed resin layer 53 are mutually bonded to be integrated, and the thin film electronic component layers 23A and the magnetic material layer 28 are mutually bonded to the foamed resin layer 53 to be integrated.

Next, as illustrated in FIG. 7C, the support board 58 and the magnetic sheet 71 are removed to obtain the carrier sheet 52 to which the thin film electronic component layers 23A and the magnetic material layer 28 are adhered via the foamed resin layer 53. On this occasion, the second electrode layers 232 of the thin film electronic components 23 and the magnetic material layer 28 enter into a state in which lower portions thereof are exposed. When the magnetic material layer 28 is copper foil with a carrier, the magnetic material layer 28 is separated with a part thereof remaining at a side of the support board 58 as illustrated in FIG. 7C.

Next, as illustrated in FIG. 7D, if necessary, the second electrode layers 232 of the thin film electronic component layers 23A and the magnetic material layer 28 are patterned. Thereby, the thin film electronic components 23 are formed.

Figure 7E:

Afterward, as illustrated in FIG. 7E, through-holes 531 are provided in the foamed resin layer 53 by laser processing or the like, and through-holes 521 are provided in the carrier sheet 52. Further, through-holes 281 are also provided in the magnetic material layer 28. The through-holes 281, 521, and 531 are used to position an interconnection structure 25.

Figure 7F:
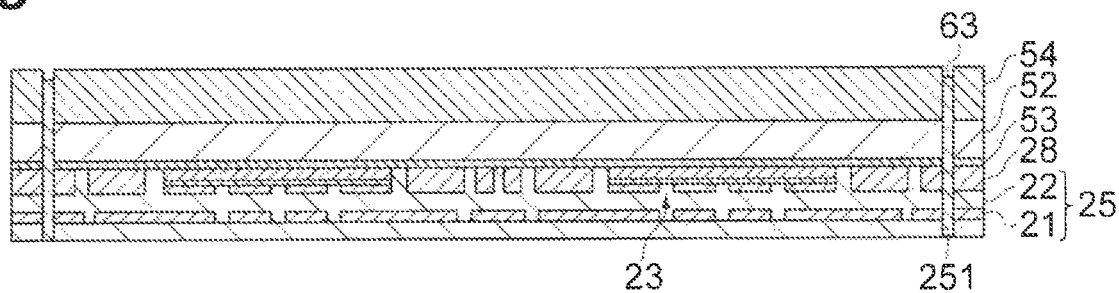

Next, as illustrated in FIG. 7F, the carrier sheet 52 to which the thin film electronic components 23 and the magnetic material layer 28 are adhered via the foamed resin layer 53 is pressed against the interconnection structure 25 formed of a conducting interconnection layer 21 and an insulating layer 22 to embed the thin film electronic components 23 and the magnetic material layer 28 in the insulating layer 22. Like the first to third manufacturing methods, the carrier sheet 52 is mounted on a press plate 54 such that pins 63, which are provided for the press plate 54 used to embed the thin film electronic components 23 and the magnetic material layer 28 in the insulating layer 22, are inserted into the through-holes 521 of the carrier sheet 52, the through-holes 531 of the foamed resin layer 53, and the through-holes 281 of the magnetic material layer 28. In this state, the press plate 54, on which the carrier sheet 52 is mounted, and the interconnection structure 25 are combined such that the pins 63 are inserted into the through-holes 251 of the interconnection structure 25. As a result, the thin film electronic components 23 and the magnetic material layer 28 are embedded in the insulating layer 22 in a state in which the second electrode layers 232 of the thin film electronic components 23 face the insulating layer 22 of the interconnection structure 25. The thin film electronic components 23, the magnetic material layer 28, and the interconnection structure 25 are pressed by the press plate 54 until a thickness of the interconnection structure 25 becomes a desired thickness of the thin film component sheet, and thereby the thin film electronic components 23, the magnetic material layer 28, and the interconnection structure 25 are integrated. Pressing conditions based on the press plate 54 can be appropriately changed depending on a material of the insulating layer 22, a material of the thin film electronic components 23, or the like. Pressure may be reduced, or heat may be applied during pressing.

Figure 7G:
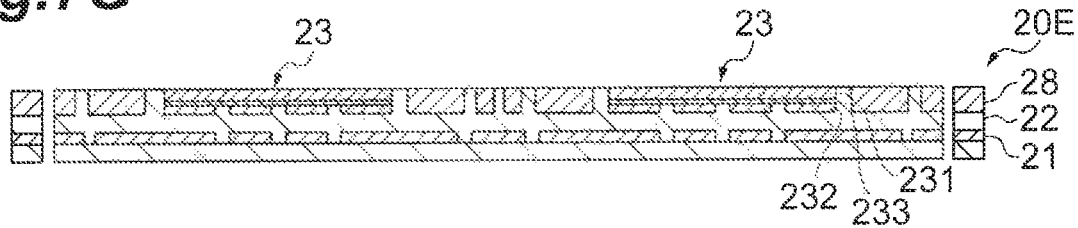

Finally, after the press plate 54 and the pins 63 are removed, the foamed resin layer 53 is foamed using heating or the like to peel the thin film electronic components 23 and the magnetic material layer 28 from the carrier sheet 52 and the foamed resin layer 53. As a result, a thin film component sheet 20E as illustrated in FIG. 7G is obtained. In the thin film component sheet 20E, the second electrode layers 232 of the thin film electronic components 23 are embedded therein, and the first electrode layers 231 are exposed to the outside. In the thin film component sheet 20E, a flat surface on which an end face 28a of the upper side of the insulating layer 28 and a main surface 231a of the upper side of the first electrode layer 231 of each of the thin film electronic components 23 are continuous is formed as a result of pressing from the press plate 54.

The thin film component sheet 20E manufactured by the fourth method has the following features. That is, when compared to the first to third methods, since no pins are used when the thin film electronic components 23 are positioned, no through-holes are formed in the thin film electronic components 23, and this is structurally different from the other thin film component sheets.

However, in the fourth method, the positioning is also performed using the pins 63 when the carrier sheet 52 and the interconnection structure 25 including the thin film electronic components 23 are integrated. Therefore, the through-holes 251 and 281 into which the pins 63 are inserted remain in the thin film component sheet 20E manufactured by the fourth method.

In the fourth method, since the magnetic material layer 28 is filled between neighboring thin film electronic components 23, primary parts of a main surface of the thin film component sheet 20E to which the thin film electronic components 23 are exposed are formed by the thin film electronic components 23 and the magnetic material layer 28, and this is the same as the thin film component sheet 20D.

In this way, according to the fourth method, since the positioning of the electronic components when the thin film component sheet is manufactured can be performed using the pins 63 provided in the magnetic material layer 28, the magnet sheet 71, and the press plate 54 formed on the support board 58, the positioning can be performed in a proper and easy way. In the thin film component sheet 20E manufactured by the fourth method, there is no need to provide through-holes for positioning of electronic components in the electronic components. Therefore, electronic components realizing desired characteristics can be manufactured in a more compact way.

In the thin film component sheet 20E manufactured by the fourth method, the magnetic material layer 28 is filled between the neighboring thin film electronic components 23. In a conventional electronic component sheets, an electrode layer and a dielectric layer are also provided at a position corresponding to the magnetic material layer 28. However, since these portions can be replaced with the magnetic material layer 28, a drop in cost is realized. In the thin film component sheet 20E in which the magnetic material layer 28 is filled between the neighboring thin film electronic components 23, since rigidity is increased at a position at which the magnetic material layer 28 is provided in comparison with other configurations in which an insulating material is provided, handleability as a sheet is improved. When the insulating material provided between the neighboring thin film electronic components 23 is a resin, there is a possibility that the resin is deformed by pressure or a temperature during processing or the like and flatness of the sheet is reduced. However, when the material provided between the neighboring thin film electronic components 23 is the magnetic material layer 28, an improvement in yield can be expected because deformation caused by pressure or a temperature is small.

(Method of Manufacturing Board with Built-In Electronic Component)

Next, a part of a method of manufacturing a board with built-in electronic component including a thin film component sheet will be described with reference to FIG. 8. In the present embodiment, a part of an example of the method of manufacturing a board with built-in electronic component is described, but the method of Manufacturing a board with built-in electronic component may be appropriately changed depending on interconnections or the like required for a finished product. Views illustrated in FIGS. 8A to 8F is a schematic view and has a different configuration than of the board with built-in electronic component illustrated in FIG. 1.

FIG. 8A illustrates a state in which a thin film component sheet 20 is laminated on a core board 10. Here, the thin film component sheet 20 illustrated in FIG. 1 is used. In the thin film component sheet 20 of FIG. 8A, a first electrode layer 231 of a thin film electronic component 23 is provided throughout an upper surface of the thin film component sheet 20, but this can be appropriately changed depending on a configuration of the thin film component sheet 20.

Next, after through-hole vias 50 (see FIG. 1) for connecting interconnection layers 30 and 40 are formed, the first electrode layer 231 of the thin film electronic component 23 in the thin film component sheet 20 is patterned to provide through-holes 231b as illustrated in FIG. 8B. Subsequently, as illustrated in FIG. 8C, through-holes 222 for vias connecting the conducting interconnection layer 21 are provided by laser processing. Subsequently, as illustrated in FIG. 8D, the through-holes 222 are filled with a conductor, and thereby vias 29 connecting the first electrode layer 231 and the conducting interconnection layer 21 are formed. If further processing is required for the first electrode layer 231, the patterning is performed.

Subsequently, as illustrated in FIG. 8E, after an insulating layer 32 included in the interconnection layer 30 is laminated on the first electrode layer 231, through-holes 321 are formed. Next, as illustrated in FIG. 8F, vias 33 and conductor layers 31 are formed on the vias 29. The insulating layer 32 and the conductor layers 31 are mutually laminated while forming the vias 33, and thereby the interconnection layer 30 is formed. An insulating layer 42 and conductor layers 41 are mutually laminated while forming vias 43 under the core board 10 in the same way, and thereby the interconnection layer 40 is formed.

A board 2 with built-in electronic component can be manufactured by a combination of the above methods. Subsequently, after the board 2 with built-in electronic component is divided as needed, an electronic component 3 is mounted via bumps 4, and thereby the board mounting structure 1 illustrated in FIG. 1 can be obtained.

As described above, according to the thin film component sheet related the present embodiment, the board with built-in electronic component including the thin film component sheet, and the method of manufacturing a thin film component sheet, since the plurality of thin film electronic components 23 are arranged to be separated from each other, cost is suppressed in comparison with conventional sheet-like electronic components. The thin film component sheet is manufactured as a sheet in which the plurality of thin film electronic components 23 are arranged on the insulating layer 22, and thereby handleablity is improved in comparison with the case in which each individual piece of the electronic component is handled. As described in the above embodiment, the sheet in which the main surface of one of the pair of electrode layers, e.g. the first electrode layer 231, in each of the plurality of thin film electronic components 23 is exposed to the main surface of the one side of the thin film component sheet can be manufactured by a relatively simple process, and a manufacturing cost can be suppressed.

When compared to conventional sheet-like electronic components, since an area that is capable of functioning as an electronic component is restricted, there is a concern that a yield is reduced if accuracy of arrangement of thin film electronic components is not high. In this respect, as described in the above embodiment, after the carrier sheet 52 to which the plurality of thin film electronic components 23 are adhered is prepared, the thin film electronic components 23 are embedded in the insulating layer 22 of the interconnection structure 25. Due to this process, an improvement in the accuracy of arrangement of thin film electronic components is realized by an improvement in accuracy of an adhesion position when the thin film electronic components 23 are adhered to the carrier sheet 52 and an improvement in the accuracy of alignment between the carrier sheet 52 and the interconnection structure 25. As described in the first to fourth methods, both the improvement in accuracy of the adhesion position when the thin film electronic components 23 are adhered to the carrier sheet 52 and the improvement in the accuracy of alignment between the carrier sheet 52 and the interconnection structure 25 can be realized. According to the thin film component sheet related to the present embodiment, the thin film electronic components can be accurately arranged at a level at which the yield of the board with built-in electronic component is not reduced.

Like the thin film component sheets 20 and 201 to 20C, in the case of the configuration in which the insulating layer 22 is filled between the plurality of thin film electronic components 23, the portions other than the thin film electronic components 23 and the conducting interconnection layer 21 can be formed by the insulating layer 22, and a thin film component sheet having excellent handleability can be inexpensively manufactured.

On the other hand, like the thin film component sheets 20D and 20E, in the case of the configuration in which the magnetic material layer 26 or 28 is filled between neighboring thin film electronic components, a drop in cost is realized in comparison with conventional thin film component sheets. In addition, rigidity of the sheet is enhanced by the magnetic material layer 26 or 28 between the neighboring thin film electronic components 23, and handleability is improved.

Although embodiments of the present invention were described, the present invention is not necessarily limited to the above embodiments and can be modified in various ways without departing from the spirit of the invention.

For example, the structure of the board 2 with built-in electronic component described in the embodiments is not limited to the embodiments, and can be appropriately changed. In addition, the structure of the thin film component sheet 20 is also not limited to the embodiments and can be appropriately changed.

What is claimed is:

1. A thin film component sheet comprising:
an interconnection layer formed of a conductor;
an insulating layer laminated on the interconnection layer and formed of an insulating material; and
a plurality of thin film electronic components, each of the plurality of thin film electronic components (1) having a pair of electrode layers and a dielectric layer between the pair of electrode layers, (2) being spaced from all other of the plurality of thin film electronic components, (3) being positioned on the insulating layer, and (4) having a through-hole extending in a thickness direction of the each of the plurality of thin film electronic components, wherein:
one of the pair of electrode layers of the each of the plurality of thin film electronic components includes a flat surface that is a part of an exterior surface of the thin film component sheet;
each of the through-holes is (1) separate and spaced from all other through-holes and (2) completely surrounded by one of the pair of electrode layers and the dielectric layer; and
the insulating material of the insulating layer is in the through-holes.

2. The thin film component sheet according to claim 1, wherein the exterior surface of the thin film component sheet is also formed by the insulating layer.

3. The thin film component sheet according to claim 1, further comprising a metal layer arranged on the insulating layer and formed between neighboring thin film electronic components among the plurality of thin film electronic components,
wherein the exterior surface of the thin film component sheet is also formed by the metal layer.

4. The thin film component sheet according to claim 1, wherein the exterior surface of the thin film component sheet has recesses through which the insulating material in the through-holes protrudes.

5. The thin film component sheet according to claim 1, further comprising second through-holes, which (1) pass through the insulating layer and the interconnection layer and extend in the thickness direction and (2) do not pass through the plurality of thin film electronic components in the thickness direction.

6. A board with built-in electronic component comprising:
the thin film component sheet according to claim 1; and
a second interconnection layer laminated on the thin film component sheet.

7. A method of manufacturing the thin film component sheet of claim 1 comprising:
a thin film electronic component preparing process of preparing a carrier sheet to which the plurality of thin film electronic components are adhered;
a thin film electronic component embedding process of preparing the carrier sheet, to which the thin film electronic components are adhered, against a second insulating layer of an interconnection structure in which the interconnection layer and the insulating layer are laminated, to thereby embed the thin film electronic components into the insulating layer and form the exterior surface of the thin film component sheet; and
a sheet removing process of removing the carrier sheet to expose the flat surface of the one of the pair of electrode layers of the each of the plurality of thin film electronic components.

8. The manufacturing method according to claim 7, wherein the thin film electronic component embedding process includes inserting pins into holes in the interconnection structure and holes in the carrier sheet and performing positioning of the interconnection structure and the carrier sheet.

9. The manufacturing method according to claim 7, wherein the thin film electronic component preparing process includes inserting pins into the through-holes in the plurality of thin film electronic components and holes in the carrier sheet and performing positioning of the plurality of thin film electronic components and the carrier sheet.

10. The manufacturing method according to claim 7, further comprising:
providing a metal layer between the plurality of thin film electronic components; and
adhering the plurality of thin film electronic components and the metal layer to the carrier sheet;
wherein the thin film electronic component embedding process includes pressing the carrier sheet, to which the plurality of thin film electronic components and the metal layer are adhered, against the second insulating layer of the interconnection structure, to thereby embed the plurality of thin film electronic components into the insulating layer and form the exterior surface of the thin film component sheet.

11. The manufacturing method according to claim 7, wherein the thin film electronic component preparing process includes adhering the carrier sheet to the plurality of thin film electronic components in a state in which the plurality of thin film electronic components are arranged above a jig plate to correspond to adhesion positions and are held by magnets.

* * * * *